United States Patent
Minami et al.

(10) Patent No.: US 7,591,625 B2
(45) Date of Patent: Sep. 22, 2009

(54) CARRYING MECHANISM, A CARRYING DEVICE AND A VACUUM PROCESSING APPARATUS

(75) Inventors: Hirofumi Minami, Kanagawa (JP); Kazuhiro Fujimura, Kanagawa (JP)

(73) Assignees: ULVAC, Inc., Chigasaki-shi (JP); Sowa MD Center Co., Ltd., Fujisawa-shi (JP)

( * ) Notice: Subject to any disclaimer, the term of this patent is extended or adjusted under 35 U.S.C. 154(b) by 0 days.

(21) Appl. No.: 12/076,160

(22) Filed: Mar. 14, 2008

(65) Prior Publication Data
US 2008/0226430 A1 Sep. 18, 2008

Related U.S. Application Data

(63) Continuation of application No. PCT/JP2006/318520, filed on Sep. 19, 2006.

(30) Foreign Application Priority Data
Sep. 16, 2005 (JP) .............................. 2005-269741

(51) Int. Cl.
*H01L 21/68* (2006.01)
(52) U.S. Cl. ................... 414/217; 414/917; 414/939; 414/744.5
(58) Field of Classification Search .................. 901/15; 414/217, 744.5, 917, 939; 74/490.01, 490.03
See application file for complete search history.

(56) References Cited

U.S. PATENT DOCUMENTS 5,151,008 A * 9/1992 Ishida et al. ............. 414/744.5
6,364,599 B1 * 4/2002 Suwa et al. ............... 414/744.1
6,558,107 B1 * 5/2003 Okuno ...................... 414/744.5
6,705,177 B2 * 3/2004 Okuno et al. ............. 74/490.01
6,840,732 B2 * 1/2005 Minami et al. ........... 414/744.5
7,245,989 B2 * 7/2007 Hosek et al. ................. 700/245
2001/0004852 A1 * 6/2001 Mitsuyoshi .............. 74/490.01

FOREIGN PATENT DOCUMENTS

| JP | 3-239483 | 10/1991 |
| JP | 2000-150617 | 5/2000 |
| JP | 2000-208588 | 7/2000 |

* cited by examiner

*Primary Examiner*—Charles A Fox
(74) *Attorney, Agent, or Firm*—Kratz, Quintos & Hanson, LLP

(57) ABSTRACT

A carrying device which can prevent an object to be carried from being contaminated with dust and carry the object to a correct position. The present invention is constructed by first and second parallelogram linkages. The second parallelogram linkage is formed by using a link of the first parallelogram linkage, has four sides with an equal length, and is linearly extended or retracted along a linear guide. Links of the first parallelogram linkage and links of the second parallelogram linkage are configured to rotate while being in a restrained state of 90° at pivots of both ends of the common link of the first and second parallelogram linkage, respectively. An arm is provided at a pivot of an end of a link opposed to the link of the first parallelogram linkage such that the arm rotates in a restrained state of 90° relative to the link.

10 Claims, 25 Drawing Sheets

Lco ... common link
Lad ... opposed link
Lao, Lcd ... First restrained link
Lbo, Lce .... Second restrained link
Laf ... Carrying arm member Lco ... common link
Lad ... opposed link
Lao, Lcd ... First restrained link
Lbo, Lce .... Second restrained link
Laf ... Carrying arm member

CARRYING MECHANISM, A CARRYING DEVICE AND A VACUUM PROCESSING APPARATUS

The present invention is a Continuation of International Application No. PCT/JP2006/318520 filed Sep. 19, 2006, which claims priority to Japan Patent Document No. 2005-269741, filed on Sep. 16, 2005. The entire disclosures of the prior applications are hereby incorporated by reference herein in their entireties.

BACKGROUND

The present invention generally relates to a carrying device for carrying a substrate to be processed (such as, e.g., a semiconductor wafer). More particularly, the invention relates to a carrying device suitable for transferring the substrate to be processed into and from a substrate processing apparatus equipped with one or more processing chambers for subjecting the substrate to various processings.

Carrying devices have been proposed for transferring substrates into and from processing chambers to perform various processings in a substrate processing apparatus (such as, a semiconductor producing apparatus).

Conventionally, an example of a known carrying device is as shown in Japanese Patent No. 2,531,261.

FIG. 33 is a plan view showing a schematic configuration of a conventional carrying device.

As shown in FIG. 33, in this carrying device 50, first and second parallel link mechanisms 50A, 50B are connected, sharing a link 51.

The first parallel link mechanism 50A is formed by links 51, 52, 53 and 54, while the second parallel link mechanism is formed by links 51, 55, 56 and 57.

Here, the effective lengths of the links 51, 52 and 55 are the same, and those of the links 53, 54, 56 and 57 are the same.

Both ends of each of the links 53, 54, 56 and 57 are rotatably connected. Meanwhile, a gear 63 is fixed to one end of the link 53 on a side of the link 51; a gear 64 is fixed to one end of the link 57 on the side of the link 51; and the gears 63 and 64 have the same diameter and mesh with each other.

In the conventional carrying device 50 having such a configuration, when a drive shaft 62 of a motor 61 fixed to the link 53 is rotated, the link 53 is rotated and the gear 63 is rotated together with the link 53.

In this case, since the links 51 and 52 are kept parallel by the first parallel link mechanism 50A, the gear 63 is rotated at an angular velocity as high as that of the drive shaft 62 with respect to the link 51. And, when the gear 63 is rotated, the gear 64 meshing with it is rotated at the same angular velocity in a reverse direction, so that the link 57 belonging to the second parallel link mechanism 50B is rotated together. As a result, a carrying table 58, which is fixed to the link 55 belonging to the second parallel link mechanism 50B, reciprocally moves linearly.

However, in such a conventional technique, since the gear 63 fixed to one end of the link 53 on the side of the link 51 meshes with the gear 64 fixed to one end of the link 57 on the side of the link 51; the gear 63 and the gear 64 rub against each other at the meshing portions; and dust (such as, metal dust) is formed therefrom. Then, this dust contaminates an object to be carried (not shown), such as a semiconductor wafer or the like, placed on the carrying table 58.

Further, in the conventional technique, the meshing portions of the gears 63 and 64 rub against each other to abrade the gear teeth, and a backlash gets larger in the meshing portions, so that the power of the first parallel link mechanism 50A is not correctly transmitted to the second parallel link mechanism 50B, and the object to be carried cannot be carried to a correct position. This problem is disclosed in Japanese Patent No. 2,531,261.

The present invention has been made to solve the problems of such a conventional technique, and its object is to provide a carrying device that does not produce any dust (such as, metal dust) and can prevent the contamination of an object to be carried (such as, a semiconductor wafer or the like) supported on a carrying table.

Further, another object of the present invention is to provide a carrying device that can rightly transmit the power of a first parallel link mechanism to a second parallel link mechanism and carry an object to be carried, to a correct position, without abrasion at sliding portions.

SUMMARY OF THE INVENTION

The present invention, which has been made to solve the above problems, is directed to a carrying mechanism including a first link mechanism formed by a parallelogram link mechanism, a second link mechanism formed by a common link and a link having the same length as that of the common link, the common link being common with a given link of the first link mechanism, and the second link mechanism being extendable and retractable linearly in a predetermined direction. A first restrained link constituting the first link mechanism and a second restrained link constituting the second link mechanism are configured to rotate in the state that the first and second restrained links are restrained at a given angle at a pivot of at least one end of the common link; and the carrying mechanism includes a carrying arm member configured such that the carrying arm member rotates in a state that the carrying arm member is restrained at a given angle relative to an opposed link opposed to the common link in the first link mechanism at a pivot of a given end of the opposed link.

A first invention of this application is directed to a carrying mechanism including a first parallelogram link mechanism, and a second parallelogram link mechanism formed by using a given link of the first parallelogram link mechanism, the second parallelogram link mechanism having four sides with an equal length and being extendable and retractable linearly in a predetermined direction. A first restrained link constituting the first parallelogram link mechanism and a second restrained link constituting the second parallelogram link mechanism are configured to rotate in a state that the first and second restrained links are restrained at given angles, respectively, at pivots of both ends of a common link shared between the first and second parallelogram link mechanisms, and the carrying mechanism includes a carrying arm member configured such that the carrying arm member rotates in a state that the carrying arm member is restrained at a given angle relative to an opposed link opposed to the common link in the first parallelogram link mechanism, at a pivot of a given end of the opposed link.

A second invention of this application is directed to a carrying mechanism comprising a first link mechanism formed by a parallelogram link mechanism, and a second link mechanism comprising a common link and a second restrained link, the common link being common with a given link of the first link mechanism, and the second restrained link being equal to the common link in length and being configured to rotate in a state that the second restrained link is restrained together with a first restrained link of the first link mechanism at a given angle at one end of the common link; and the carrying mechanism comprises a carrying arm member configured such that the carrying arm member is rotated in a state that the carrying arm member is restrained at a given angle relative to an opposed link opposed to the common link in the first link mechanism, at a pivot of a given end of the opposed link.

According to the present invention, as described, in the above inventions, the length of the first restrained link can be equal to that of the carrying arm member.

According to the present invention, as described, in the above inventions, an angle formed by the first restrained link and the second restrained link can be an angle other than 90°.

In the present invention, as described, in the above inventions, a third parallelogram link mechanism may be provided, the third parallelogram link mechanism being formed by using the first restrained link and including a first arm member and a second arm member, the first arm member and the second arm member being configured to rotate around pivots of both ends of the first restrained link in such a state that the first arm member is restrained at a given angle relative to the common link and that the second arm member is restrained at a given angle relative to the opposed link.

On the other hand, the present invention is directed to a carrying device comprising a carrying mechanism, a parallel link type arm mechanism, and a carrying portion, the carrying mechanism comprising a first link mechanism formed by a parallelogram link mechanism, and a second link mechanism being formed by a common link and a link having the same length as that of the common link, the common link being common with a given link of the first link mechanism, and the second link mechanism being extendable and retractable linearly in a predetermined direction. A first restrained link constituting the first link mechanism and a second restrained link constituting the second link mechanism are configured to rotate in the state that the first and second restrained links are restrained at a given angle at a pivot of at least one end of the common link, and the carrying mechanism includes a carrying arm member configured to rotate in a state that the carrying arm member is restrained at a given angle relative to an opposed link opposed to the common link in the first link mechanism, at a pivot of a given end of the opposed link. The parallel link type arm mechanism is formed by using the carrying arm member; and the carrying portion is driven by the parallel link type arm mechanism and supports an object to be carried.

Further, the present invention is directed to a vacuum processing apparatus with a plurality of processing chambers connected to a vacuum exhaust system, the vacuum processing apparatus comprising a carrying chamber and a vacuum processing chamber, the carrying chamber being equipped with a carrying device, the carrying device comprising a carrying mechanism, a parallel link type arm mechanism, and a carrying portion, the carrying mechanism comprising a first link mechanism formed by a parallelogram link mechanism, and a second link mechanism formed by a common link and a link having the same length as that of the common link, the common link being common with a given link of the first link mechanism, and the second link mechanism being extendable and retractable linearly in a predetermined direction. A first restrained link constituting the first link mechanism and a second restrained link constituting the second link mechanism are configured to rotate in the state that the first and second restrained links are restrained at a given angle at a pivot of at least one end of the common link; and the carrying mechanism comprises a carrying arm member configured to rotate in a state that the carrying arm member is restrained at a given angle relative to an opposed link opposed to the common link in the first link mechanism, at a pivot of a given end of the opposed link, the parallel link type arm mechanism being formed by using the carrying arm member, and the carrying portion being adapted to be driven by the parallel link type arm mechanism and to support an object to be carried, and the vacuum processing chamber being communicated with the carrying chamber and configured to receive and deliver the object by using the carrying device.

In the following description, the operating principle of the present invention will be explained with reference to the drawings. It is noted that the first and second inventions, which will be explained below, are included in the present invention described above.

FIG. 1 is a first schematic configuration diagram showing an operating principle of the carrying mechanism according to the first invention, in which a first parallelogram link mechanism PLM1 is fitted to a rotary shaft (point O).

In the carrying mechanism shown in FIG. 1, the first parallelogram link mechanism is formed by links Lad, Lcd, Lco and Lao, whereas a second parallelogram link mechanism PLM2 is formed by links Lbo, Lbe, Lce and Lco. Here, in relation to the present invention, Link Lco - - - common link;
Link Lad - - - opposed link;
Link Lao, Lcd - - - first restrained link;
Link Lbo, Lce - - - second restrained link; and
Link Laf - - - carrying arm member.

Further, a linear guide (shown by one-dot chain lines in the figure) is provided on a straight line passing points O and E of the second parallelogram link mechanism.

In FIG. 1, assuming that a rotating angle of the link Lao with respect to an X axis is θa, a fixed angle between the link Lce and the link Lcd is $\theta_1$, a fixed angle between the link Lbo and the Link Lao is $\theta_2$, a fixed angle between the link Lad and the link Laf is $\theta_3$, an angle between the X axis and a straight line (shown by two-dot chain line) connecting the rotary shaft (point O) and a tip portion (point F) of the link Laf is γ, and an angle between the linear guide and the X axis is $\theta_e$, the coordinates (Xf, Yf) of the point F can be represented by expressions (1) and (2) given below, if the following conditions A are satisfied.

<Conditions A>
1. The long sides of the first parallelogram link mechanism are equal in length (Lcd=Lao=Laf≡Lb)
2. The four sides of the second parallelogram link mechanism are equal in length (Lbo=Lbe=Lce=Lco≡Ls).
3. The fixed angle between the link Lce and the link Lcd is equal to that between the link Lbo and the link Lao (θ1=θ2≡$\theta_{12}$).

<Mathematical Description>

$$Xf = OF \cdot \cos\gamma, \quad Yf = OF \cdot \sin\gamma \qquad (1)$$

$$Yf = \tan\gamma \cdot Xf \qquad (2)$$

Here, the relationships are such that: OF=2Lb·cos β, γ=θe−π−($\theta_{12}$−$\theta_3$)/2, β=π−($\theta_{12}$+$\theta_3$)/2−α, and α=θe−$\theta_{12}$−θa.

Since θe, $\theta_{12}$ and $\theta_3$ are constant angles independent of θa as understood from the above relational expressions, γ is a constant value independent of θa.

As shown in the expression (2), this shows that the point F is positioned on the straight line LF passing through the point O and crossing the X axis at the constant angle .gamma.

Further, since the length of the straight line OF is expressed by a linear function of θa alone, the point F moves on the straight line described by the expression (2) as the rotating angle θa of the link Lao varies.

On the other hand, if the length of the link Laf is different from that of the link Lao, the point F moves on curves shown in FIG. 3.

In FIG. 3, the locus of the point F is calculated under the same consideration as in the above-mentioned mathematical description in the case that $\theta_1=\theta_2=30°$, $\theta_3=90°$, $\theta e=150°$, Lbo=Lco=Lce=Lbe=30 mm, and Lao=Lcd=120 mm.

As understood from FIG. 3, in the case that Laf=120 mm (that is, in the case that the length of the link Laf is equal to that of the link Lao), the point F moves on the straight line represented by the expression (2).

However, if the Laf=100 mm or Laf=140 mm (that is, if the length of the link Laf is different from that of the link Lao), the locus of the point F varies on a curved line, and does not move on the straight line represented by the expression (2).

FIG. 2 is a second schematic configuration diagram showing the operational principle of the carrying mechanism according to the present invention, and shows a case where a first parallelogram link mechanism is fitted to a pivot moving mechanism (point E).

In the mechanism shown in FIG. 2, the first parallelogram link mechanism is formed by links Lad, Lcd, Lce and Lae, whereas a second parallelogram link mechanism is constructed by links Lbo, Lbe, Lce and Lco.

Here, in relation to the present invention,

Link Lce - - - common link;

Link Lad - - - opposed link;

Link Lae, Lcd - - - first restrained link;

Link Lco, Lbe - - - second restrained link; and

Link Laf - - - carrying arm member.

Further, a linear guide (shown by a one-dot chain line in the figure) is provided on a straight line passing through points O and E of the second parallelogram link mechanism.

In FIG. 2, assuming that a rotating angle of the link Lbo with reference to an X axis is $\theta b$, a fixed angle between the link Lco and the link Lcd is $\theta_1$, a fixed angle between the link Lbe and the Link Lae is $\theta_2$, a fixed angle between the link Lad and the link Laf is $\theta_3$, an angle between the X axis and a straight line (shown by a two-dot chain line) connecting the rotating shaft (point O) and a tip portion (point F) of the link Laf is $\gamma$, and an angle between the linear guide and the X axis is $\theta e$, the coordinates (Xf, Yf) of the point F can be represented by expressions (3) and (4) given below, if the following conditions B are satisfied.

<Conditions B>

1. The long sides of the first parallelogram link mechanism are equal in length (Lcd=Lae=Laf≡Lb).
2. The four sides of the second parallelogram link mechanism are equal in length (Lbo=Lbe=Lce=Lco≡Ls).
3. The fixed angle between the link Lco and the link Lcd is equal to that between the link Lbe and the link Lae ($\theta_1=\theta_2\equiv\theta_{12}$).
4. The relationship between the fixed angle $\theta_1$ between the link Lco and the link Lcd and the fixed angle $\theta_3$ between the link Lad and the link Laf is such that they have the same magnitude and in the same phase or in reverse phases ($\theta_1=\pm\theta_3$).

<Mathematical Description>

$$Xf=OF\cdot\cos\gamma,\ Yf=OF\cdot\sin\gamma \tag{3}$$

$$Yf=\tan\gamma\cdot Xf \tag{4}$$

Here, there are relations that when $\theta_1=\theta_3$, OF=2A·cos α, $\gamma=\theta e-\cos^{-1}\{(Ls^2+A^2-Lb^2)/(2Ls\cdot A)\}$, $A^2=Lb^2+Ls^2-2Lb\cdot Ls\cdot\cos\theta_2$, and α=θe−θb. On the other hand, there are relations that when $\theta_1=-\theta_3$, OF=2Ls·cos α−2Lb·cos(α+θ$_{12}$), γ=θe, and α=θe−θb.

As understood from the above relational expressions, when $\theta_1=\theta_3$, Lb, Ls and $\theta_2$ are constant values independent of the rotating angle θb of the Lbo, and thus A is a constant value. Further, since θe is a constant value independent of the rotating angle θb, γ is a constant value independent of θb. Further, when $\theta_1=-\theta_3$, γ=θe (=a constant value).

As described in the formula (4), this shows that when $\theta_1=\pm\theta_3$, the point F is positioned on the straight line passing through the point O and crossing the X axis at the constant angle γ.

Further, since the length of the straight line 0F is expressed by a linear function of θb alone, the point F moves on the straight line described by the expression (4) as the rotating angle θb of the link Lbo varies.

On the other hand, if the length of the link Laf is different from that of the link Lao, the point F moves on curves as shown in FIG. 4.

In FIG. 4, the locus of the point F is calculated under the same consideration as in the above-mentioned mathematical description in the case that $\theta_1=\theta_2=\theta_3=30°$, $\theta e=150°$, Lbo=Lco=Lce=Lbe=30 mm, and Lae=Lcd=120 mm.

As understood from FIG. 4, in the case that Laf=120 mm (that is, in the case that the length of the link Laf is equal to that of the link Lao), the point F moves on the straight line represented by the expression (4).

However, if the Laf=100 mm or Laf=140 mm (that is, if the length of the link Laf is different from that of the link Lae), the point F varies in the curved line, and does not move on the straight line represented by the expression (4).

Next, the principle of the second invention will be explained with reference to the drawings.

FIG. 5 to FIG. 11 are schematic configuration diagrams showing the operating principle of the carrying mechanism according to the second invention.

The framing conditions of this carrying mechanism are as follows.

<Framing Conditions [1]> - - - See FIGS. 5 and 6.

(1) A link 101, a link 102a, a link 103a, a link 103b and a link 104 are connected rotatably around pivots (shafts) O, A, B, C and D. Here, a four link mechanism is formed by the link 101, the link 102a, the link 103a and the link 104 (First link mechanism).

(2) The link 103b is restrained fixedly at the pivot C at an arbitrary angle (η=∠BCD) relative to the link 103a, and an L-form arm 103 is formed by the link 103a and the link 103b (First and second restrained links).

(3) The pivots O, A, B, C and D are vertical to a horizontal plane (the drawing sheet).

(4) The pivot O and the pivot D moves relatively to each other only on a straight line connecting these pivots, as indicated by arrow AD (the restrained condition between the pivots O and D). Note that no restrained conditions exist for the movements of the other pivots.

If the framing conditions [1] are satisfied, when any one of the link 101, the link 102a, the link 103a, the link 103b and the link 104 rotates around the pivot with which that link is connected directly, the positions of the respective pivots are determined, corresponding to the rotating angle thereof due to the existence of the restrained condition for the pivot O and the pivot D (the above condition (4)) (If no restrained condition is present between the pivots O and D, the positions of the pivots O, A, B, C and D are indefinite.)

However, since there is a range in which these links prop one another and do not move in connection with the respective lengths of the links, there is a limitation of "within respectively movable ranges of the links".

<Framing Conditions [2]> - - - See FIGS. 5 and 6.

The link 101 and the link 103a are equal in length (OA=CB), and the link 102a, the link 103b and 104 are equal in length (AB=OC=CD).

Here, in relation to the present invention, the link 103b and the link 104 correspond to the second link mechanism, whereas the link 104 corresponds to the common link.

When the framing conditions [2] are added to the framing conditions [1] and when any one of the link 101, the link 102a, the link 103a, the link 103b and the link 104 rotates by an angle θ around the shaft with which that link is connected directly, each of internal angles of the quadrangle OABC changes by 2θ.

This motion will be explained with reference to FIGS. 5 and 6.

Due to the above framing conditions [2], the quadrangle OABC is a parallelogram, and the triangle OCD is an isosceles triangle.

FIGS. 5 and 6 show cases in which the links are rotated around the pivot O. In FIG. 5, $\gamma=-2\eta+\eta$ holds between the angle (θ) formed by the Y axis and the link 101 and an angle ($\gamma=\angle OAB$) formed by the link 102a and the link 101; $\beta=2\theta+(\pi-\eta)$ holds between the angle θ and the angle ($\beta=\angle ABC$) formed by the link 102a and the link 103a; and $v=\theta+(\pi/2-\eta)$ holds between the angle θ and each of the angles formed by the links 104 and 103b, respectively, with the X axis ($=\angle COD=\angle CDO$).

Similarly, $\gamma=2\theta+(\pi-\eta)$, $\beta=-2\theta+\eta$ and $v=-\theta-(\pi/2-\eta)$ hold in the case of the link mechanism shown in FIG. 6. Here, although the expressions representing γ, β and v are different between the cases in FIGS. 5 and 6, this is based on differences in how to take the respective angles in the figures, and they are essentially the same.

Further, since the link 103b is fixed to the link 103a (η=a constant angle) as mentioned above, when the link 101 is rotated by Δθ around the pivot O, the amount of change (Δγ) of the angle formed by the link 102a and the link 101 and the amount of change (Δβ) of the angle formed by the link 102a and the link 103a are each twice as large as the angular change (Δθ) of the link 101 (2Δθ).

Furthermore, since Δv=Δθ, when the link 104 is rotated by Δθ around the pivot O, the amount of change (Δγ) of the angle formed by the link 102a and the link 101 becomes twice as large as the rotating angle (Δθ) of the link 104 (2Δθ).

While the above description corresponds to the case in which the link is rotated by Δθ around the pivot O, all the links are relatively rotated by Δθ around the pivots to which they are connected directly, since the quadrangle OABC is a parallelogram and the triangle OCD is an isosceles triangle.

Therefore, when any one of the link 101, the link 102a, the link 103a, the link 103b and the link 104 is rotated by Δθ around the pivot with which that link is connected directly, each of the internal angles of the quadrangle OABC changes by 2Δθ.

Framing Conditions [3] - - - See FIGS. 7 to 9.
(1) In any link (hereinafter referred to as "link U" selected from a link 101, a link 102a, a link 103a, a link 103b, a link 104 and an L-form arm 103, an arm 102b is connected rotatably around one pivot (hereinafter referred to as "pivot S") of the link U (carrying arm member).
(2) The length of the arm 102b is equal to that between the pivots of the link U.
(3) The arm 102b is restrained at a fixed manner at an arbitrary angle (ξ) relative to other link connected to the pivot S of the link U.

In the following descriptions, the framing conditions [3] will be explained by referring to FIG. 7 to FIG. 9.

FIG. 7 or 8 shows a configuration in which the framing conditions [3] are incorporated into the link mechanism shown in FIG. 5 or 6. The arm 102b is connected rotatably around a pivot A, the length of the arm 102b is equal to that of the link 101 and the link 103a (OA=AE), and the arm 102b is restrained at a fixed manner at an arbitrary angle (ξ=∠BAE) relative to the link 102a. The link 102a and the arm 102b thereby constitute an L-form arm 102. The other configuration is the same as shown in FIGS. 5 and 6.

When the framing conditions [2] and [3] are added to the above-described framing conditions [1], the arm 102b rotates around the pivot A integrally with the link 102a, so that, as understood from the explanation on the above framing conditions [2], an angle (∠OAE) formed by the arm 102b and the link 101 rotates around the pivot A by an angle (2Δθ) twice as large as the rotating angle (Δθ) of the link 101 when the link 101 is rotated by Δθ around the pivot O, or when the link 104 is rotated by Δθ around the pivot O, or when the link 103b is rotated by Δθ around a pivot D.

Meanwhile, the triangle OAE is an isosceles triangle wherein ∠AOE=∠AEO. That is, when the angle (∠OAE) formed by the arm 102b and the link 101 increases by 2Δθ, each of ∠AOE and ∠AEO decreases by Δθ.

Therefore, when the link 101 or the link 104 is rotated around the pivot O, or when the link 103b is rotated around the pivot D, the tip (E) of the arm 102b moves on a straight line (L) connecting the tip (E) of this arm 102b with the pivot O.

On the other hand, FIG. 9 shows an embodiment in which the link 103b is rotated around the pivot D in the configuration shown in FIG. 8. Here, the arm 102b whose length is equal to the length between the pivots D and B (BD=BE) is connected rotatably around the pivot B; and the arm 102b is restrained at a fixed manner at an arbitrary angle (ξ=∠ABE) relative to the link 102a, so that the L-form arm 102 is formed by the link 102a and the arm 102b.

In this case, when the link 101 or the link 104 is rotated around the pivot O, or when the link 103b is rotated around the pivot D, the tip (E) of the arm 102b moves on the straight line (L) connecting the tip (E) of this arm 102b and the pivot D.

Framing Conditions [4] - - - See FIGS. 10 and 11.
(1) A link 105 and a link 107 are connected rotatably around a pivot A and a pivot O at both ends of a link 101 of a first link mechanism, and a link 106 is connected rotatably around a pivot F at an end of the link 105 and a pivot G of an end of a link 107, thereby constructing a four link mechanism (a third link mechanism).
(2) The pivot F and the pivot G are vertical to the horizontal plane (the drawing sheet).
(3) The link 105 is restrained at a fixed manner at a constant angle (∠BAF) relative to a link 102a, and the link 107 is restrained fixedly at a constant angle (∠COG) relative to a link 104. Further, an angle (∠BAF) formed by the link 105 and the link 102a is equal to that (∠COG) formed by the link 107 and the link 104, and these angles are any angle other than 0° and 180° (μ=∠BAF=∠COG, μ≠0, 180°).
(4) The length of the link 105 is equal to that of the link 107 (AF=OG), and the length of the link 106 is equal to that of the link 101 (GF=OA).

In the following descriptions, the framing conditions [4] will be explained with reference to FIGS. 10 and 11.

FIGS. 10 and 11 illustrate a configuration in which the framing conditions [4] are incorporated into the carrying mechanism shown in FIGS. 5 and 6. The other configuration is the same as in FIGS. 5 and 6.

When the framing conditions [2] and [4] are added to the framing conditions [1], even if the first link mechanism formed by the links 101, 102*a*, 103*a* and 104 comes into a dead point state (in a straight line), the parallelogram link mechanism constructed by the links 101, 105, 106 and 107 makes the angle ($\gamma=\angle OAB$) formed by the link 102*a* and the link 101 change by an angle ($2\theta$) twice as large as the rotating angle ($\theta$) of the link 101, the link 104 and the link 103*b*. Further, when the third link mechanism constructed by the links 101, 105, 106 and 107 comes into a dead point state, a similar operating state is realized by the action of the first link mechanism constructed by the links 101, 102*a*, 103*a* and 104.

According to the present invention as explained above, the power transmission and carriage can be performed only by the combination of the link mechanisms, without any sliding portion as in the prior art where the gears mesh together.

Therefore, any dust (such as, metal dust) is not formed, so that contamination of semiconductor wafers or the like as objects to be carried can be prevented.

Further, since the backlash problem due to abrasion of the sliding portion, etc. does not occur, the objects can be carried to a correct position.

More particularly, since the second parallelogram link mechanism is constructed by the four links according to the first invention, the point E shown in FIG. 1 can move linearly with good accuracy in order to obtain the carrying mechanism with good carrying precision, for example.

On the other hand, according to the second invention, the carrying mechanism with a smaller number of links and a simpler configuration can be obtained.

Further, when the length of the first restrained link is equal to that of the carrying arm member in this invention, the tip of the carrying arm member can be moved linearly.

When this invention is constructed such that the angle formed by the opposed link and the carrying arm member is 90° and the angle formed by the first restrained link and the second restrained link is 90°, the tip of the carrying arm member can be moved in the extending and retracting directions of the second link mechanism.

Further, when the angle formed by the first restrained link and the second restrained link is an angle other than 90° in the first invention, the second parallelogram link mechanism forms a parallelogram, not coming in a straight line, in a position where the carrying arm member overlaps with the first restrained link. Consequently, the carrying arm member can be rotated in a stable manner.

When the present invention comprises the third parallelogram link mechanism which is formed by using the first restrained link and comprises the first arm member and the second arm member, the first arm member and the second arm member being configured to rotate around pivots of both ends of the first restrained link in such a state that the first arm member is restrained at a given angle relative to the common link and that the second arm member is restrained at a given angle relative to the opposed link, the first parallelogram link mechanism and the third parallelogram link mechanism cannot be in the dead-point positions at the same time. Consequently, the rotating directions do not become unstable at their respective dead-point positions and the carrying arm member can be stably rotated.

Thus, according to the present invention, it is possible to provide a vacuum processing apparatus that can prevent contamination of semiconductor wafers or the like as the objects to be carried, and can contribute to an improved throughput by carrying the objects to correct positions.

According to the present invention, the objects to be carried (such as, semiconductor wafers) are not contaminated, and the objects can be carried to the correct position with good precision.

DETAILED DESCRIPTION OF THE EMBODIMENTS

In the following, preferred embodiments of the present invention will be explained in detail with reference to the drawings.

Figure 12:
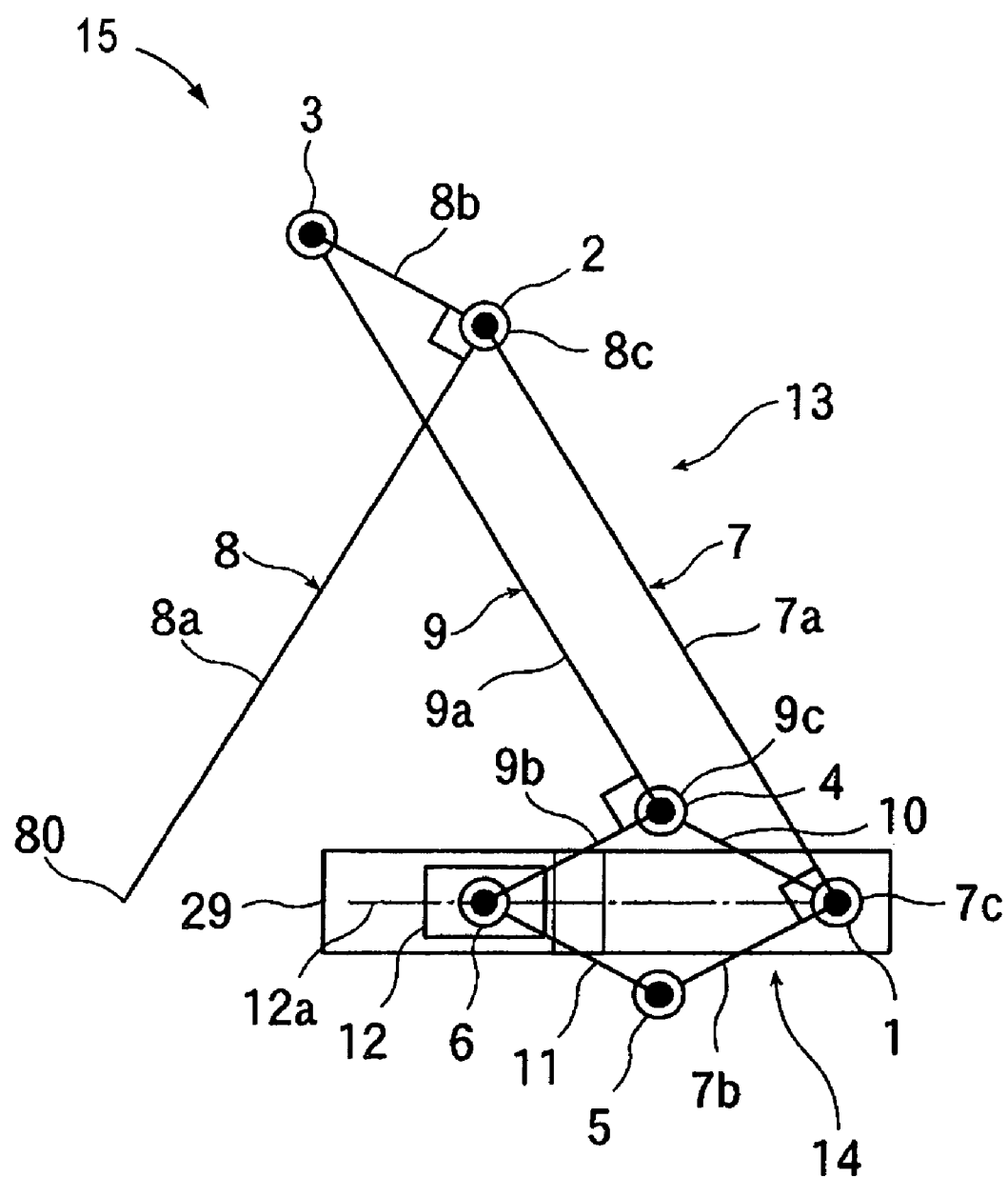
FIG. 12 is the fundamental configuration of an embodiment of the carrying mechanism according to the first invention.

FIG. 12 is a schematic view showing the basic configuration of an embodiment of the carrying mechanism according to the first invention, and FIGS. 13(a) to (d) are schematic views showing motions of the same carrying mechanism.

Figure 1:
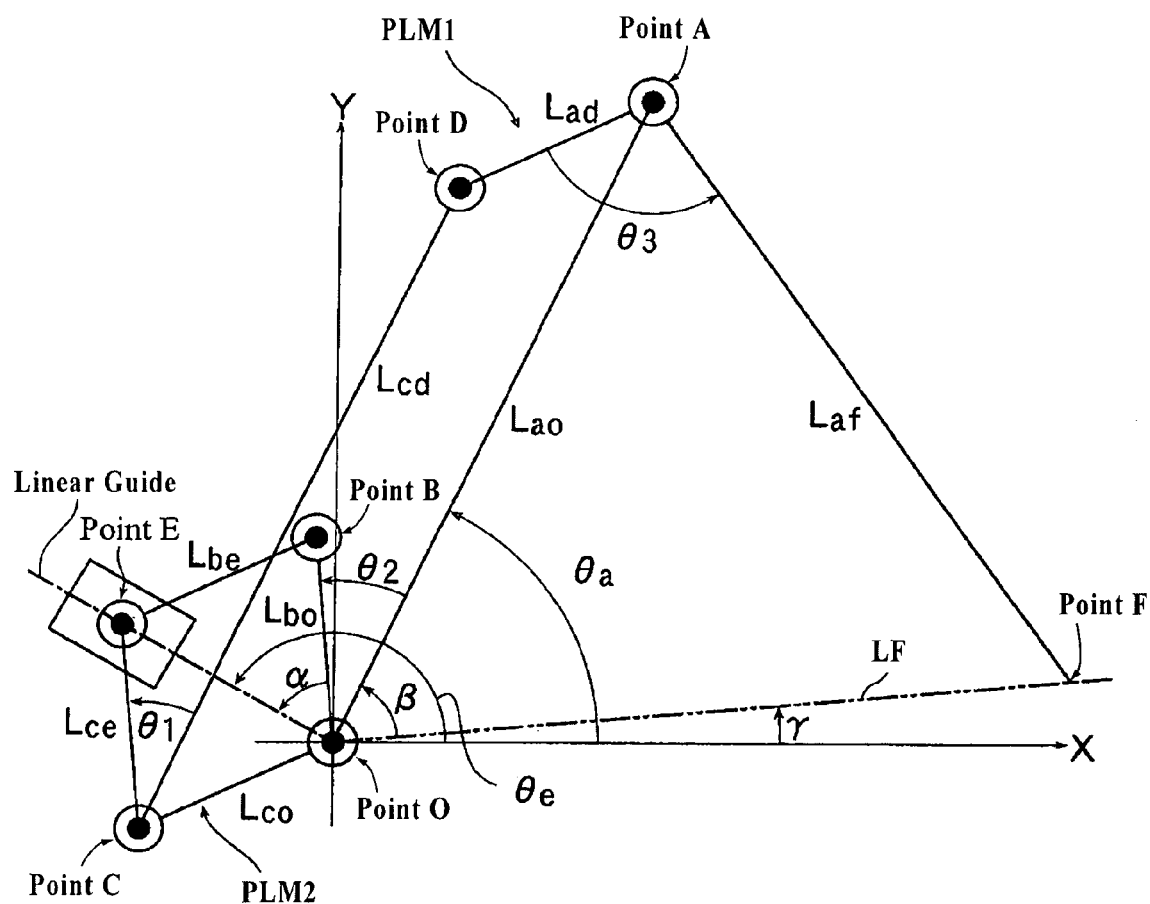
FIG. 1 is a first schematic configuration diagram showing the operating principle of the carrying mechanism according to the first invention.

As shown in FIG. 12, the carrying mechanism 15 of this embodiment is of a type in which a first parallelogram link mechanism is fitted to the rotating shaft (point O) illustrated in FIG. 1, and the carrying mechanism comprises a first parallelogram linkage (first parallelogram link mechanism) 13 and a second parallelogram linkage (second parallelogram link mechanism) 14.

The first parallelogram linkage 13 is formed by an arm (link) 7a, a link 8b, a link 9a and a link 10.

In the case of this embodiment, members longer than the link 8b and the link 10 are used as the arm 7a and the link 9a.

On the other hand, the second parallelogram linkage 14 is formed by the link (common link) 10 of the first parallelogram linkage 13; and each of the lengths of a link 7b, a link 11 and a link 9b is equal to the length of the link 10.

The link 10 is fitted rotatably around a pivot 1 and a pivot 4 at both ends thereof, and the link (opposed link) 8b opposed to the link 10 is fitted rotatably around a pivot 2 and a pivot 3 at both ends thereof.

This embodiment is constructed such that the arm 7a (first restrained link) constituting the first parallelogram linkage 13 and the link 7b (second restrained link) constituting the second parallelogram linkage 14 are rotatable while being restrained at an angle ($\theta_2$) of 90° at a pivot 7c of one end of the link 10 shared between the first and second parallelogram linkages 13 and 14.

An L-form arm 7 is formed by fixedly connecting the arm 7a and the link 7b, the fixedly connecting portion 7c between the arm 7a and the link 7b is fitted rotatably around the pivot 1; an end of the arm 7a on a side opposite to the fixedly connecting portion 7c is fitted rotatably to the pivot 2; and further an end of the link 7b on a side opposite to the fixedly connecting portion 7c is fitted rotatably to the pivot 5.

Consequently, the embodiment is constructed such that a driving force of a motor not shown is given to this L-form arm 7.

At a pivot 9c of the other end of the link 10 shared between the first and second parallelogram linkages 13 and 14, the link 9a (first restrained link) constituting the first parallelogram linkage 13 and the link 9b (second restrained link) constituting the second parallelogram linkage 14 are configured to rotate, while being restrained at an angle ($\theta_1$) of 90°.

That is, an L-form link 9 is formed by fixedly connecting the link 9a with the link 9b; a fixedly connecting portion 9c between the link 9a and the link 9b is fitted rotatably around the pivot 4; an end of the link 9a on a side opposite to the fixedly connecting portion 9c is fitted rotatably to a pivot 3; and an end of the link 9b on a side opposite to the fixedly connecting portion 9c is fitted rotatably to a pivot 6.

Here, the second parallelogram linkage 14 is constructed such that the heights of the pivot 4 and the pivot 5 are different, and such that when the L-form arm 7 is rotated, the pivot 5 passes under the pivot 4, for example.

Further, this embodiment is provided with an arm 8a (carrying arm member), which is configured such that, at the pivot 2 at one end of the link 8b opposed to the link 10 of the first parallelogram linkage 13, the arm 8a rotates while being restrained at an angle ($\theta_3$) of, for example, 90° relative to the link 8b.

That is, the arm 8a and the link 8b are fixedly connected to form an L-form arm 8; a fixedly connecting portion 8c between the arm 8a and the link 8b is fitted rotatably around the pivot 2; and an end of the link 8b on a side opposite to the fixedly connecting portion 8c is fitted rotatably to the pivot 3.

This embodiment is constructed such that the arm 8a is equal to the arm 7a and the link 9a in length and that owing to this, a tip 80 of the arm 8a passes on a straight line (carrying line) connecting the pivot 1 and the pivot 6, as later described.

On the other hand, in this embodiment, the above-mentioned pivot 1 is provided at one end portion of an elongate base plate 29. On this base plate 29 is provided a linear guide (guiding portion) 12a, which is configured to extend in a longitudinal direction of the base plate 29 and not to change the positional relationship relative to the pivot 1.

In addition, the pivot 6 of the second parallelogram linkage 14 is fitted to a pivot moving mechanism 12 which is configured to move along the linear guide 12a, so that the second parallelogram linkage 14 is extended and retracted linearly along the linear guide 12a and the pivot 6 moves along a one-dot chain line passing through the pivot 1 in the figure.

FIGS. 13(a) to (d) are schematic views showing the operating principle of this embodiment.

FIG. 13(a) is taken as an initial state. This state is the same as that shown in FIG. 12.

As such, when the L-form arm 7 is rotated by an angle θ in a CW (clockwise) direction around the pivot 1, the link 7b rotates by the angle θ in the CW direction around the pivot 1 together with the arm 7a.

At such time, the pivot 6 is moved linearly in a direction apart from the pivot 1 along the linear guide 12a in synchronization with the motions of the link 7b and the link 11 by means of the pivot moving mechanism 12.

Accordingly, the second parallelogram linkage 14 changes its shape while keeping a shape of a parallelogram; and the link 10 rotates by the angle θ in a CCW (counterclockwise) direction around the pivot 1.

In this embodiment, since the first parallelogram linkage 13 is formed by the arm 7a, the link 8b, the link 9a and the link 10, when the link 10 rotates by the angle θ in the CCW direction around the pivot 1, the link 8b rotates by the angle θ in the CCW direction around the pivot 2, and thereby the arm 8a rotates by the angle θ in the CCW direction around the pivot 2 together with the link 8b.

When a series of these motions are considered relative to the pivot 2, the arm 7a rotates by the angle θ in the CW direction around the pivot 2, and simultaneously the arm 8a rotates by the angle θ in the CCW direction around the pivot 2. Therefore, the arm 8a rotates by an angle 2θ in the CCW direction around the pivot 2 relative to the arm 7a (such state being shown in FIG. 13(b)).

In this embodiment, since the length of the arm 8a is equal to that of the arm 7a, the above rotation of the arm 8a makes the tip 80 thereof move on the linear guide 12a (carrying line) toward the pivot 1.

Further, in this embodiment, since the pivot 4 and the pivot 5 are made different in height, when the L-form arm 7 is rotated in the CW direction, the pivot 5 passes under the pivot 4 so that the positional relationship between the pivot 4 and the pivot 5 is reversed as shown in FIG. 13(c).

In this embodiment, since the length of the arm 8a is equal to that of the arm 7a, the tip 80 of the arm 8a moves along the carrying line, and passes above the pivot 1. When the L-form arm 7 is continuously rotated in the CW direction, the tip 80 of the arm 8a moves in a direction apart from the pivot 1 as shown in FIG. 13(d).

In order to return the state of FIG. 13(d) to that of FIG. 13(a), the L-form arm 7 is rotated in the reverse direction (CCW) to that of the above-described motions. The rotating power of the L-form arm 7 is transmitted to the L-form arm 8 in this way, so that the motions can be controlled to rotate the L-form arm 8 by an angle twice as large as the rotating angle of the L-form arm 7.

Figure 14:
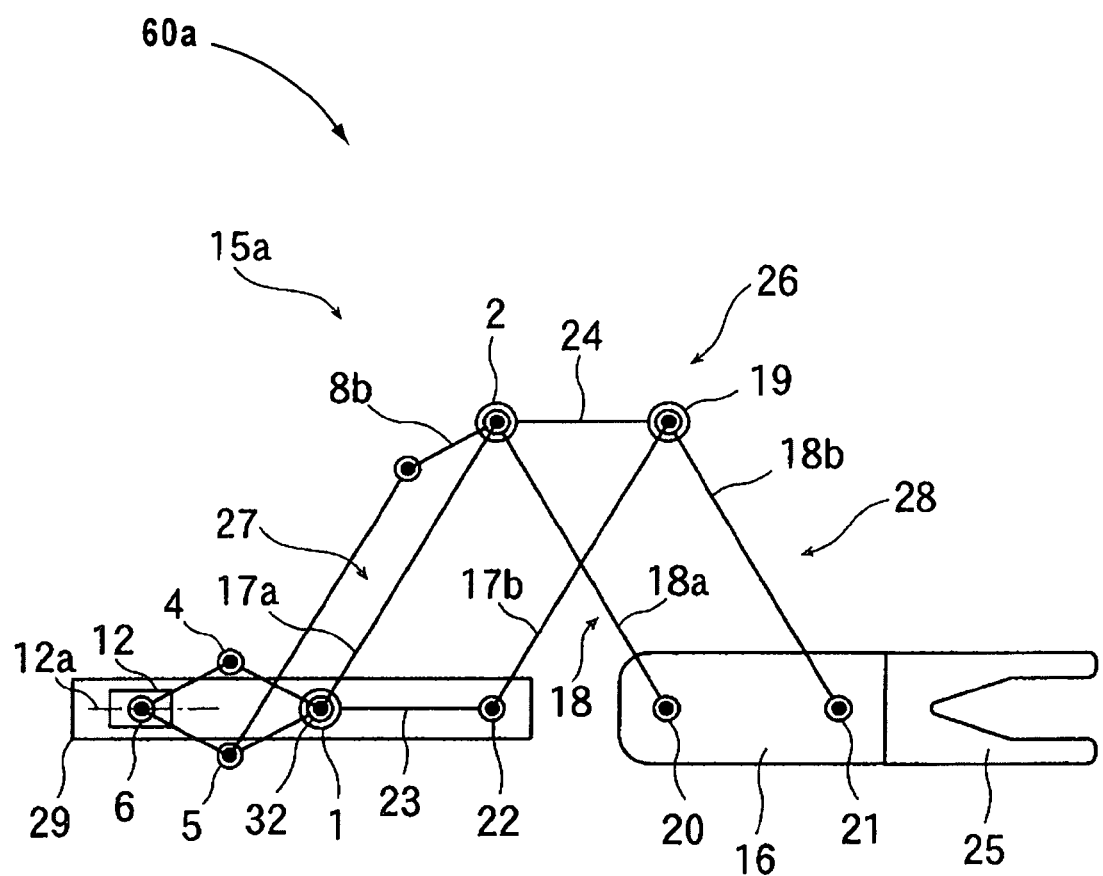
FIG. 14 is a schematic configuration diagram showing an embodiment of a carrying device using the carrying mechanism according to the first invention.

FIG. 14 is a schematic configuration diagram showing an embodiment of the carrying device using the carrying mechanism of the first invention, and the carrying device is based on a parallel link type arm mechanism.

As shown in FIG. 14, the carrying device 60a of this embodiment uses a carrying mechanism 15a having a configuration similar to that of the above-mentioned carrying mechanism 15, and possesses a parallel link type arm mechanism 26. In the following descriptions, a detailed explanation of the portions corresponding to the above-described embodiments is omitted.

This parallel link type arm mechanism 26 comprises an upper arm linkage 27 which is formed by upper arms 17a, 17b and links 23, 24 opposed in parallel, respectively, and a lower arm linkage 28 which is formed by lower arms 18a, 18b, the link 24 and a carrying table (carrying portion) 16 opposed in parallel, respectively.

The upper arm 17a of the upper arm linkage 27 corresponds to the arm 7a; the links 23, 24 are fitted rotatably to the pivots 1 and 2 at both ends thereof, respectively; and the link 17b are fitted rotatably to pivots 22, 19 on a side opposite to the pivots 1 and 2 of the links 23, 24.

Here, the pivot 22 is provided on an extension line of the linear guide 12a on the base plate 29. Further, the lower arm 18a of the lower arm linkage 28 corresponds to the arm 8a, and is connected in a fixed manner to the link 8b to form an L-form arm 18; and a fixedly connecting portion thereof is fitted rotatably to the pivot 2.

Further, the lower arm 18b opposed to the lower arm 18a is fitted rotatably to a pivot 19 of the upper arm linkage 27, and these lower arms 18a, 18b are fitted rotatably to pivots 20 and 21 provided on the carrying table 16.

This embodiment is constructed such that the lengths (distances between the pivots) of the links 23, 24 and a distance between the pivots (length between the pivots 20 and 21) of the carrying table 16 are all identical. Further, the lengths (distances between the pivots) of the upper arms 17a and 17b and the lower arms 18a and 18b are all made identical.

An end effector 25 is fitted to one tip portion of the carrying table 16 so as to place an object to be carried (not shown), such as a wafer.

With respect to the carrying device 60a of this embodiment, since the linear guide 12a, the pivot 1, the link 23 and the pivot 22 are fitted onto the common base plate 29, the relative positional relationships among the linear guide 12a, the pivot 1, the link 23 and the pivot 22 do not change during the extending and retracting motions and the rotating motions.

Although the pivot 1 and the pivot 22 are connected by the link 23 in the carrying device 60a of this embodiment, the pivot 1 and the pivot 22 may be formed directly on the common base plate 29. Although the link 23 is unnecessary in this case, the extending and retracting motions and the rotating motions as a carrying device can be performed in the same manner as in the carrying device 60a of this embodiment.

Figure 15:
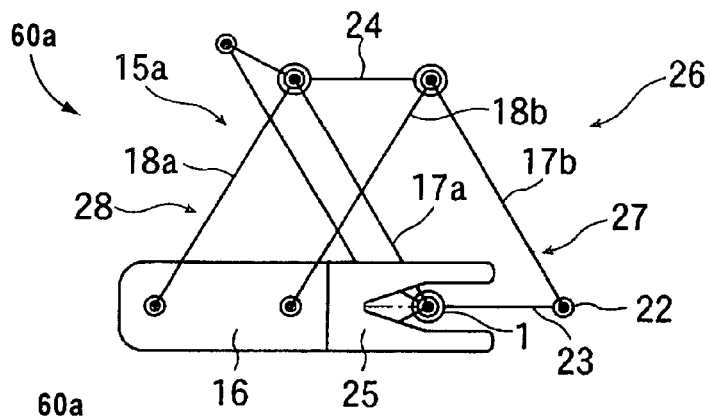
FIGS. 15(*a*) to (*d*) are schematic views showing extending and retraining motions of the carrying device of the same embodiment.
Figure 15:
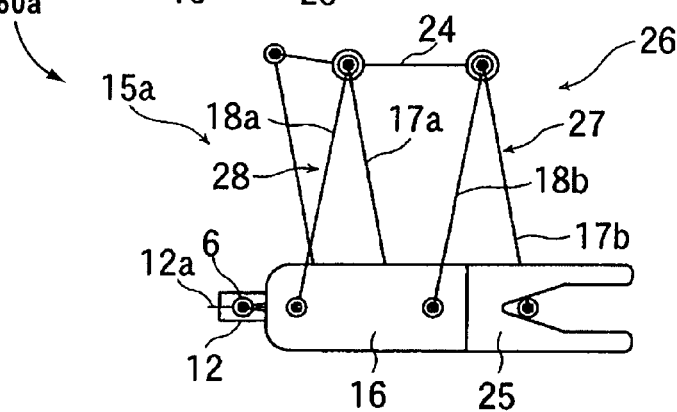
Figure 15:
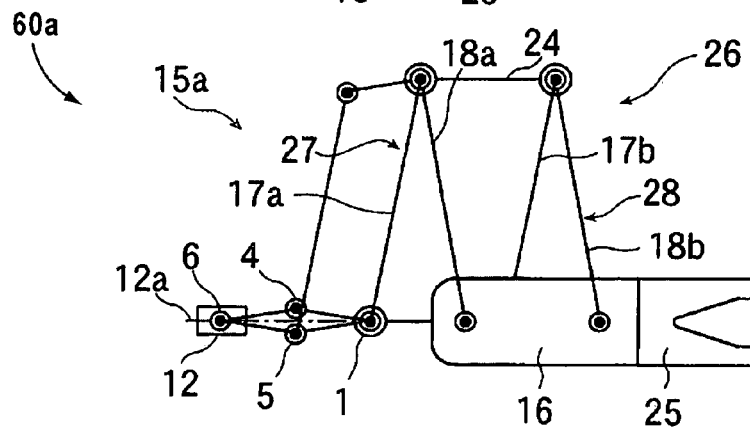
Figure 15:
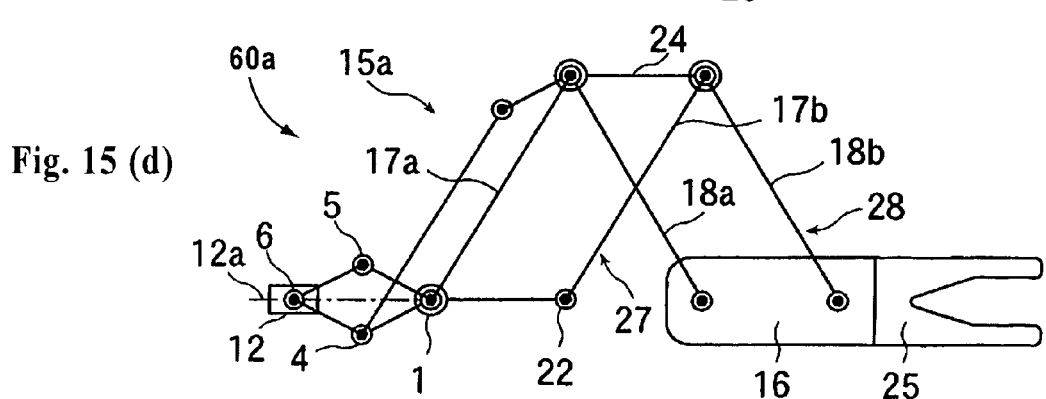

FIGS. 15(a) to (d) are schematic views showing the extending and retracting motions of the carrying device of this embodiment. FIG. 15(a) shows a retracted state as an initial state.

In the case of this embodiment, since an upper arm linkage 27 in the shape of a parallelogram is formed by upper arms 17a, 17b and links 23, 24, when the upper arm 17a is rotated by an angle θ in the CCW direction around the pivot 1, the upper arm 17b also rotates by the angle θ in the CCW direction around the pivot 22, thereby moving the link 24, while being kept in parallel to the link 23.

Simultaneously, as explained in connection with the operating principle of FIG. 13, the lower arm 18a rotates relative to the upper arm 17a by an angle 2θ in the CCW direction around the pivot 2 by the action of the carrying mechanism 15a.

When the upper arm 17a rotates by the angle θ in the CCW direction around the pivot 1 in this way, the positions of the lower arm 18a and the link 24 are determined, and the parallelogram shape of the lower arm linkage 28 is unambiguously determined. Consequently, as shown in FIG. 15(b), FIG. 15(c) and FIG. 15(d), the carrying device performs an extending motion. Thus, the end effector 25 moves in a direction from the pivot 1 to the pivot 22 (in a right direction in the figures) on an extension line (carrying line) of the linear guide 12a.

In order to return from the extended state of FIG. 15(d) to the retracted state shown in FIG. 15(a), the upper arm 17a is rotated in the reverse direction (CCW direction) to the above-described motion. When the carrying device is extended and retracted by rotating the upper arm 17a in this way, the carrying table 16 and the end effector 25 can be moved in parallel on the carrying line.

As described above, in the carrying device 60a of this embodiment, the second parallelogram linkage 14 is formed by sharing the link 10 constituting the first parallelogram linkage 13, and the pivot 6 of the second parallelogram linkage 14 is moved in parallel by the pivot moving mechanism 12. Therefore, since the rotating motion of the upper arm 17a is transmitted to the lower arm 18a and the lower arm 18a is rotated by an angle twice as large as the rotating angle of the upper arm 17a, the motion of the upper arm linkage 27 is accurately transmitted to the lower arm linkage 28.

As described above, according to this embodiment, any sliding portion where gears mesh together does not exist unlike in the prior art; and the carriage can be performed through the transmission of the power only by the combination of the link mechanisms.

Therefore, any dust (such as, metal dust) is not generated, and contamination of semiconductor wafers or the like as objects to be carried can be prevented.

Further, according to this embodiment, the objects can be carried to a correct position by accurately transmitting the power between the upper arm linkage 27 and the lower arm linkage 28, without causing the backlash problem due to abrasion of a sliding portion, etc.

Although the extending and retracting motions of the carrying device 60a are explained in the above-described embodiment based on an example in which the upper arm 17a is rotated around the pivot 1, it is noted that the extending and retracting motions can also be performed when the upper arm 17b is rotated around the pivot 22. The motions are the same as in the case of the rotation of the upper arm 17a; and thus, a detailed explanation thereof is omitted.

Although the extending and retracting motions of the carrying device 60a are explained in the above-described embodiment based on the example in which the upper arm 17a is rotated around the pivot 1, it is also possible that a driving shaft 32 is installed at the pivot 1, the upper arm 17a is fitted to this driving shaft 32, and the upper arm 17a is rotated around the pivot 1 by rotating the driving shaft 32.

On the other hand, in the case where the carrying device 60a of this embodiment is rotated, the base plate 29 is rotated around the pivot 1 in such a state that the parallel link type arm mechanism 26 retracts as shown in FIG. 15(a), while the positional relationship between the base plate 29 and the upper arm 17a is not changed. Alternatively, the carrying device is rotated by simultaneously rotating the base plate 29 and the driving shaft 32 by the same angle in the same direction in the same retracting state.

Figure 16:
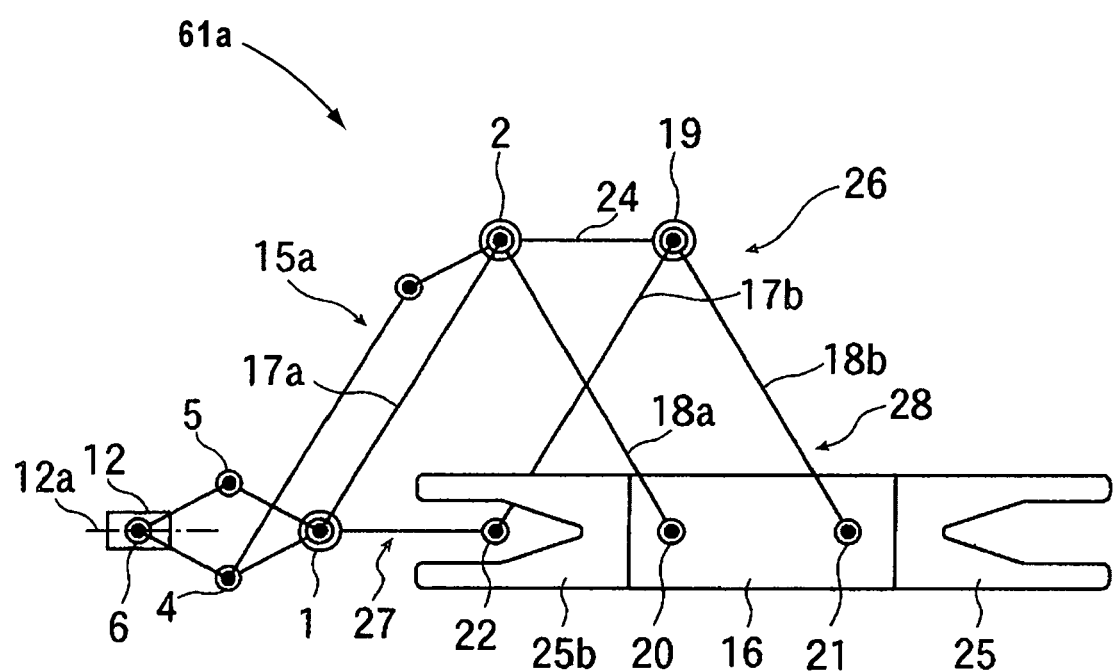
FIG. 16 is a schematic configuration diagram of a modified example of the same carrying device.

On the other hand, although the end effector 25 is fitted to only one side of the carrying table 16 in the above-mentioned carrying device 60a, the present invention is not limited thereto. For example, as shown in FIG. 16, end effectors 25a, 25b may be fitted to two positions at both sides of the carrying table 16.

According to such a configuration, efficiency of carrying the objects to be carried can be improved. Extending and retracting motions of this carrying device are basically the same as those of the carrying device 60a shown in FIGS. 15(a) to (d); and thus, an explanation thereof is omitted.

In a substrate processing apparatus equipped with a carrying device like that of the present invention, there is a demand that two objects to be carried (such as, wafers or the like) be held at a time or a demand that the rotating radius of the carrying device be decreased.

In order to respond to such demands, the lower arm linkage 28 of the carrying device 60a shown in FIG. 14 needs to move beyond a position where it overlaps with the upper arm linkage 27 (hereinafter, referred to as "overlapped position").

Figure 17A:
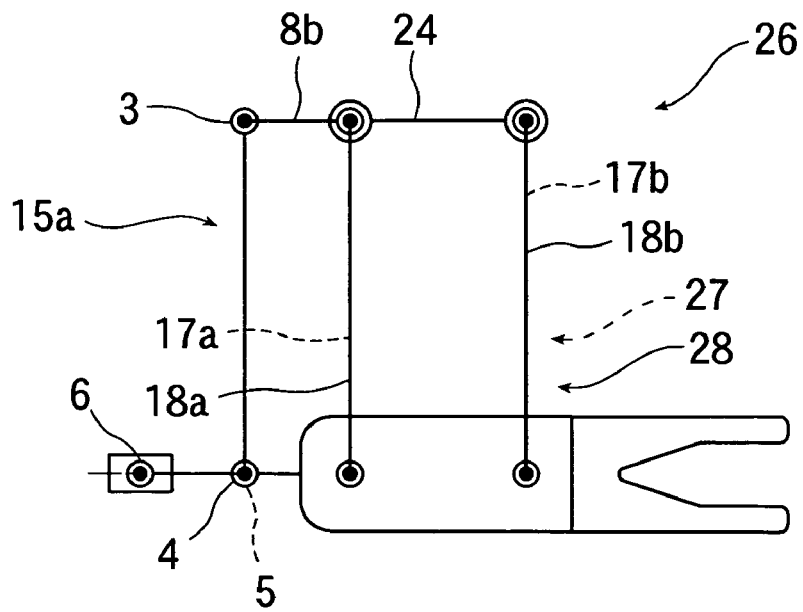
FIG. 17(*a*) is a schematic view showing a state in which the carrying device of the same embodiment is in an overlapped position, and FIG. 17(*b*) is a schematic view showing the state of the carrying mechanism at that time.
Figure 17B:
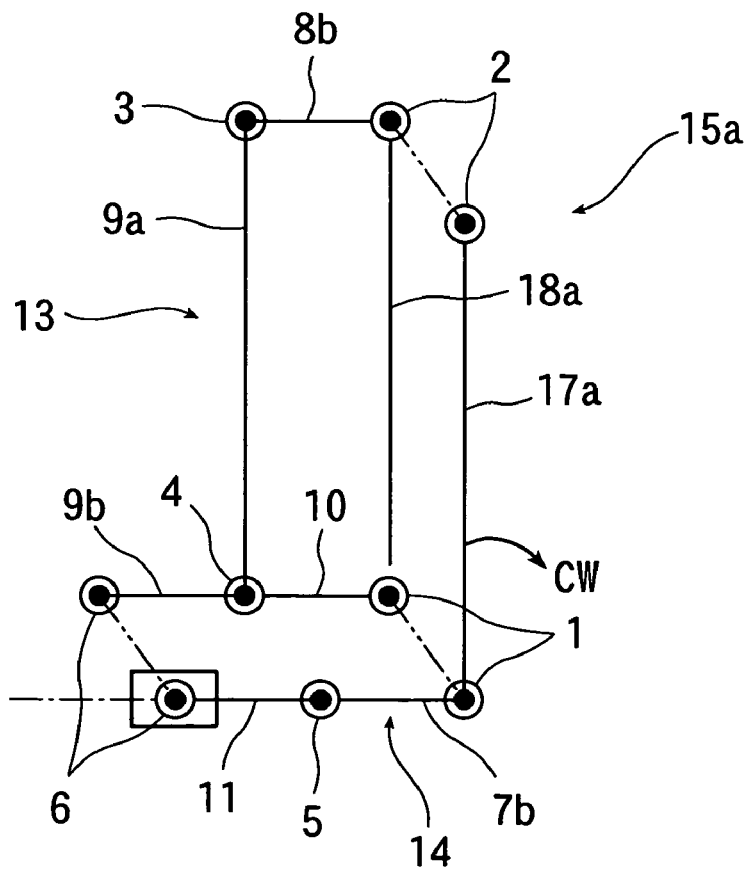

FIG. 17(a) is a schematic view showing a state in which the carrying device of this embodiment is in the overlapped portion, and FIG. 17(b) is a schematic view showing the state of the carrying mechanism at that time.

As understood from FIGS. 17(a) and (b), the link 7b, the link 11, the link 9b and the link 10 forming the second parallelogram linkage 14 are in a straight line. (For facilitating the understanding of the positional relationship among the links, the pivots 1, 2 and 6 are divided into two in FIG. 17(b).)

As shown in FIG. 17(b), when the upper arm 17a is rotated in the CW direction around the pivot 1 in this state, the rotating direction of the link 10 cannot be forcibly determined, so that the state on whether the link 10 is rotated in either the CW direction or the CCW direction around the pivot 1 is not determined.

As a result, since the rotating direction of the link 8b constituting the first parallelogram linkage 13 is not determined, the rotating direction of the lower arm 18a is not determined either; thus, there is a possibility that the lower arm linkage 28 cannot move beyond the overlapped position. In this way, the movement of each of the linkages becomes unstable at the overlapped position.

FIGS. 18(a) to (c) are schematic configuration diagrams showing the configuration and the extending and retracting motions of another embodiment of the carrying mechanism according to the first invention. This embodiment is to solve the above problem.

As shown in FIGS. 18(a) to (c), particularly in FIG. 18(b), in the carrying mechanism 15b of this embodiment, a fitting angle $\theta_2$ of a link 7b to an arm 7a and a fitting angle $\theta_1$ of a link 9b to a link 9a are equal, and are other than 90°. (In FIG. 18(b), for facilitating understanding of the positional relationship among the links, a pivot 2 and a pivot 3 are divided into two.)

Consequently, a fitting angle $\theta_4$ of a linear guide 12a relative to a carrying line (X-axis direction) is an angle other than 0°, and is particularly equal to the fitting angle $\theta_2$ of the link 7b to the arm 7a in this embodiment (=the fitting angle $\theta_1$ of the link 9b to the link 9a).

Thus, this configuration makes a tip 80 of a link 8a and a pivot moving mechanism 12 (pivot 6) relatively move at an angle other than 0°.

In this invention, the fitting angle $\theta_2$ of the link 7b to the arm 7a, the fitting angle $\theta_1$ of the link 9b to the link 9a and the fitting angle $\theta_4$ of the linear guide 12a to a carrying line are not particularly limited, except that $\theta_1=\theta_2$ must be satisfied. These angles may be set to optimal angles to meet requirements for configurations of respective devices, moving ranges, etc.

Figure 13:
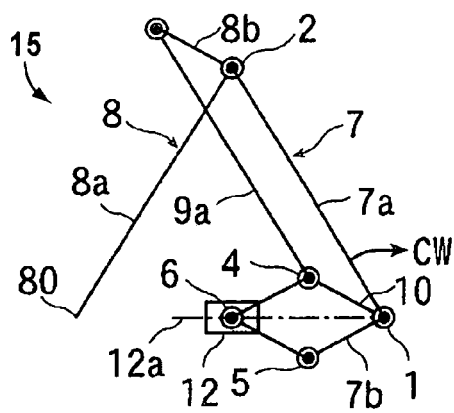
FIGS. 13(*a*) to (*d*) are schematic views showing the operation of the same carrying mechanism.
Figure 13:
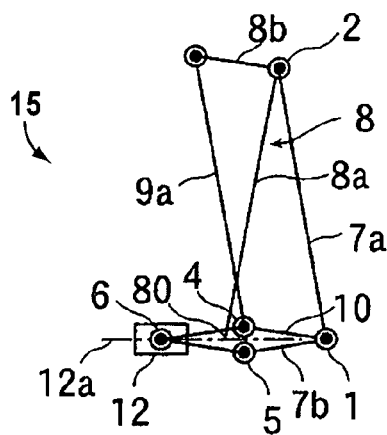
Figure 13:
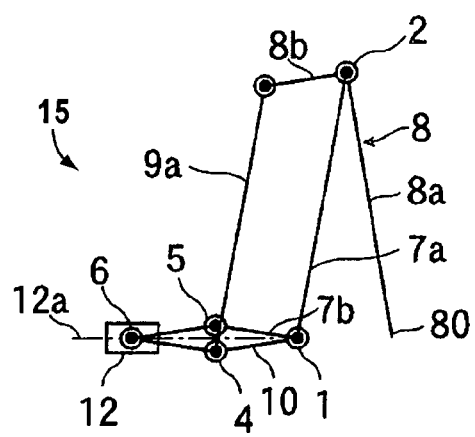
Figure 13:
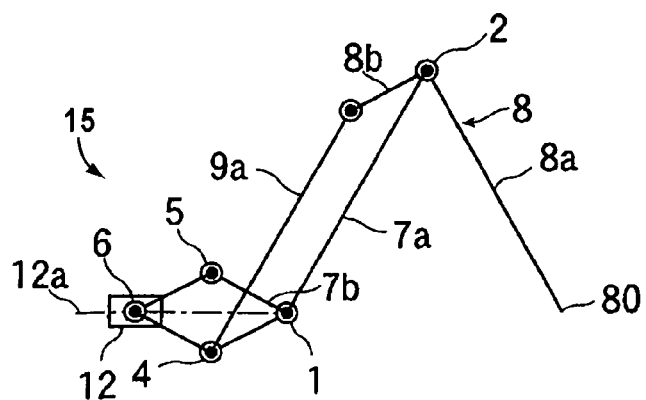

FIG. 18(a) shows a retracted state in an initial state of this embodiment, and when the arm 7a is rotated in this state by an angle $\theta$ in the CW direction around a pivot 1, an arm 8a rotates by an angle $2\theta$ in the CCW direction around a pivot 2 relative to the arm 7a according to the principle illustrated in FIG. 13.

Thus, with the above-described structural arrangement, the arm 8a reaches immediately above the arm 7a, as shown in FIG. 18(b).

At this time, although the arm 8a and the arm 7a are in an overlapped position, the fitting angle $\theta_2$ of the link 7b to the arm 7a and the fitting angle $\theta_1$ of the link 9b to the link 9a are other than 90°. Therefore, the link 7b, the link 11, the link 9b and the link 10 forming a second parallelogram linkage 14 are not in a straight line but form a parallelogram; different from the case of the carrying mechanism 15 shown in FIG. 13.

Thus, when the arm 7a is rotated around the pivot 1 in the CW direction, the link 7b rotates around the pivot 1 in the CW direction, whereas the link 10 rotates around the pivot 1 in the CCW direction. Therefore, the arm 8a passes immediately above the arm 7a, and the arm 8a reaches a position apart from the pivot 1 as shown in FIG. 18(c).

On the other hand, in returning from the state shown in FIG. 18(c) to that shown in FIG. 18(a), the arm 7a is rotated in the reverse direction (CCW) to the above-described movement. Such an operation can make the arm 8a pass stably immediately above the arm 7a, while the rotating direction does not become unstable at the overlapped position.

Figure 19:
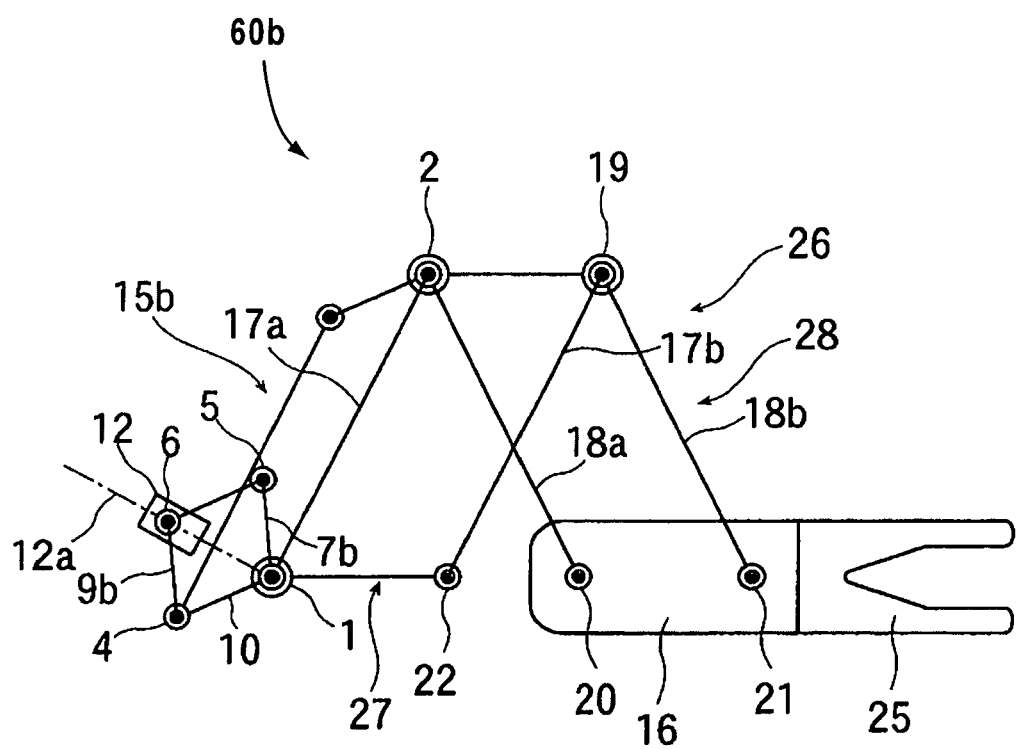
FIG. 19 is a schematic configuration diagram showing another embodiment of the carrying device according to the present invention.

FIG. 19 is a schematic configuration diagram showing another embodiment of the carrying device according to the first invention, which is a carrying device using a parallel link type arm mechanism.

As shown in FIG. 19, the carrying device 60b of this embodiment uses the above-mentioned carrying mechanism 15b, and possesses the parallel link type arm mechanism 26.

Here, the parallel link type arm mechanism 26 is constructed by using an upper arm linkage 27, a lower arm linkage 28, a carrying table 16 and an end effector 25 as in the carrying device 60a shown in FIG. 14, and thus a detailed explanation thereof is omitted.

Further, the carrying mechanism 15b is configured such that the arm 7a illustrated in FIG. 16 corresponds to the upper arm 17a, and the arm 8a corresponds to the lower arm 18a. The configuration of the other parts of the carrying mechanism 15b is the same as what is illustrated in FIG. 16, and thus an explanation thereof is omitted.

The motions of the carrying device 60b of this embodiment are the same as those of the carrying device 60a shown in FIG. 14 except for the motions of the above-mentioned carrying mechanism 15b, and the motions of the parts of carrying mechanism 15b are the same as what are illustrated in FIGS. 18(a) to (c). Therefore, detailed explanation of the extending and retracting motions and the rotating motions of this embodiment is omitted.

As explained above, in the carrying device 60b of this embodiment, a second parallelogram linkage 14 is formed, with a link 10 shared, the link 10 constituting a first parallelogram linkage 13, and a pivot 6 of the second parallelogram linkage 14 is moved in parallel by a pivot moving mechanism 12. Therefore, the rotating movement of the upper arm 17a is transmitted to the lower arm 18a, and the lower arm 18a rotates by an angle twice as great as the rotating angle of the upper arm 17a. So, the movement of the upper arm linkage 27 can be accurately transmitted to the lower arm linkage 28.

In this manner, according to this embodiment, formation of dust (such as, metal dust) at a sliding portion does not occur like the above embodiments, so that contamination of semiconductor wafers or the like as objects to be carried can be prevented, and the objects can be carried to a correct position by accurately transmitting the power between the upper arm linkage 27 and the lower arm linkage 28.

Further, in this embodiment, since the fitting angle of the link 7b to the upper arm 17a and the fitting angle of the link 9b to the link 9a are equal and are other than 90° and the pivot moving mechanism 12 is fitted such that it moves at an angle other than 0° relative to the extending and retracting movement direction (carrying line) of the carrying table 16, the lower arm 18a is passed immediately above the upper arm 17a in a stable manner, while the rotating direction does not become unstable at the overlapped position. Thus, the lower arm linkage 28 can be moved beyond the overlapped position in a stable manner.

On the other hand, as to a substrate processing apparatus equipped with such a carrying device as in the present invention, there is a demand that one wishes to further carry the objects to be carried (such as, wafers or the like).

Figure 20:
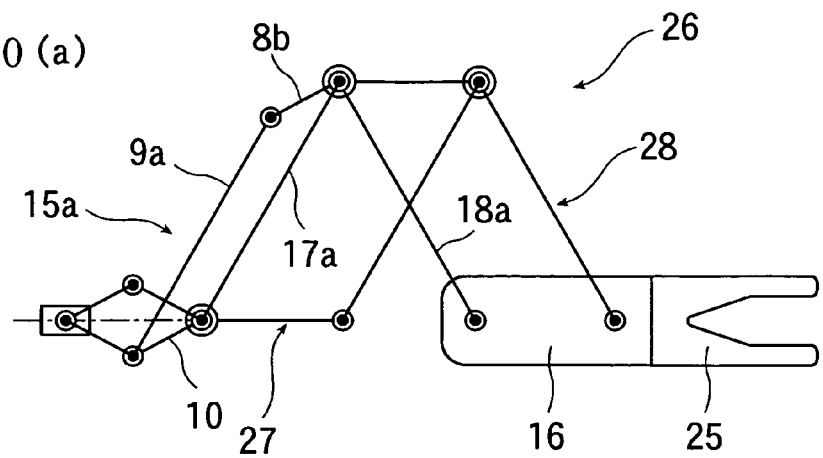
FIGS. 20(*a*) to (*c*) are views for explaining the problems to be solved in the present invention.
Figure 20:
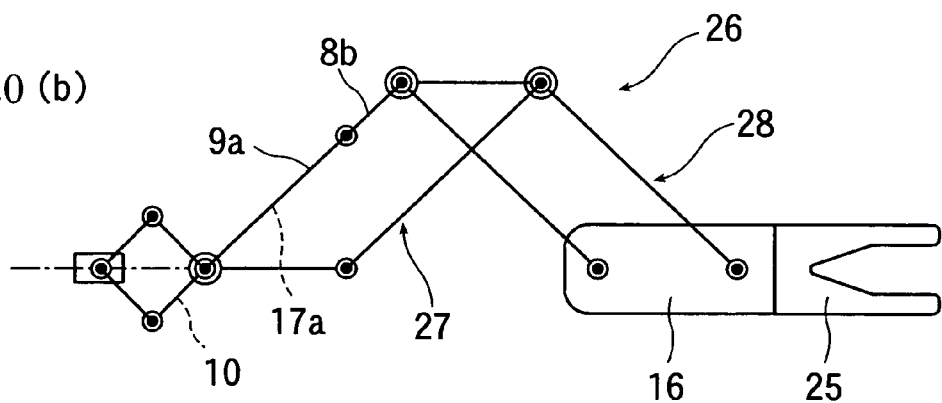
Figure 20:
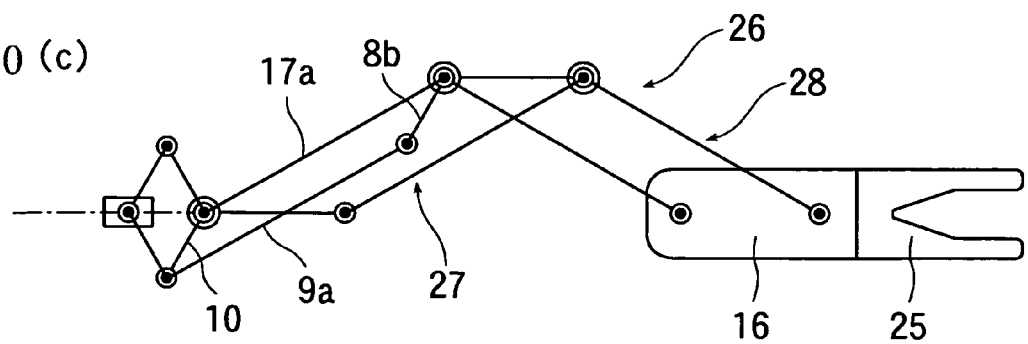

In order to respond to such a demand, the reachable distance of the end effector 25 can be increased as shown in FIG. 20(c) by rotating the upper arm 17a in the CW direction so that the angle formed between the lower arm linkage 28 and the upper arm linkage 27 of the parallel link type arm mechanism 26 shown in FIG. 20(a) can be as large as possible.

In this movement, during when the parallel link type arm of the carrying device comes into the state of FIG. 20(c) from the state of FIG. 20(a), the upper arm 17a, the link 10, the link 9a and the link 8b come into a straight line as shown in FIG. 20(b) (hereinafter, this position is referred to as "dead-point position").

Figure 21:
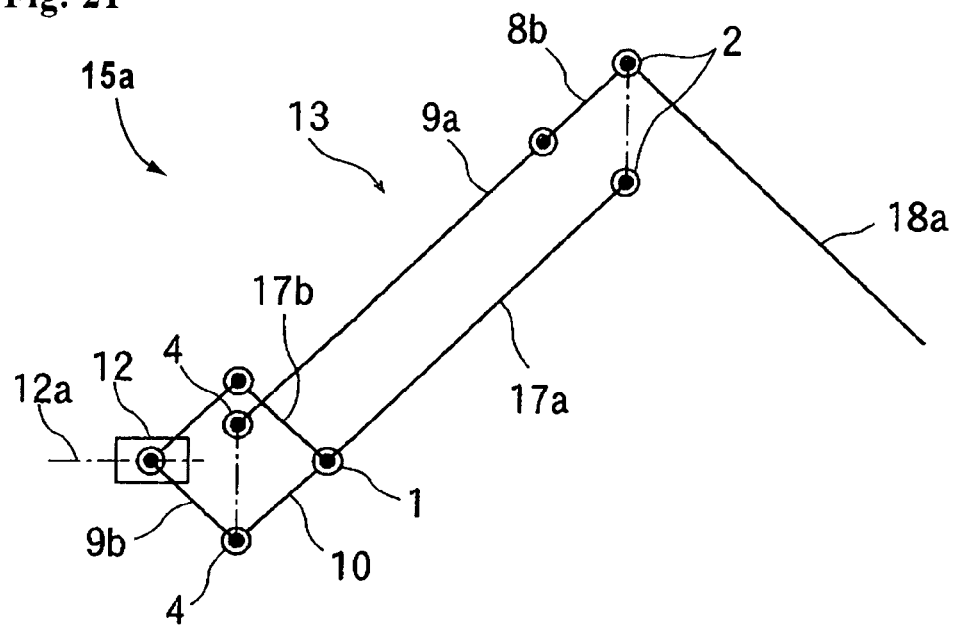
FIG. 21 is a schematic view showing the state of the carrying mechanism in a dead-point position.

FIG. 21 shows the state of the carrying mechanism 15a in the dead-point position. (For facilitating the understanding the positional relationship among the links, the pivots 2 and 4 are divided into two in FIG. 21.)

In FIG. 21, when the upper arm 17a is rotated around the pivot 1 in the CW direction, the link 10 rotates in the CCW direction through the movement of the pivot moving mechanism 12. However, since the rotating direction of the link 8b cannot be forcibly determined in this state, whether the link 8b rotates around the pivot 2 in either the CW or CCW direction is not determined.

As a result, since the rotating direction of the link 8b constituting the first parallelogram linkage 13 is not determined, the rotating direction of the lower arm 18a is not determined either, so that there is a possibility that the lower arm linkage 28 cannot move beyond the dead-point position. In this way, the movement of each of the linkages becomes unstable at the dead-point position.

Figure 22:
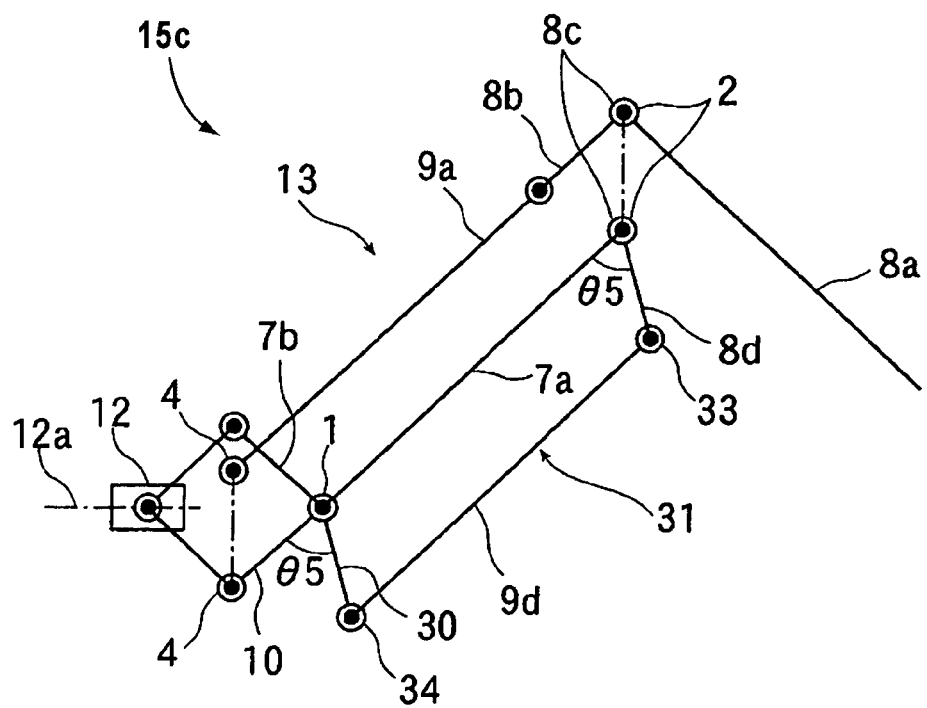
FIG. 22 is a schematic configuration diagram of another embodiment of the carrying mechanism according to the first invention.

FIG. 22 is a schematic configuration diagram showing another embodiment of the carrying mechanism according to the first invention, which is to solve the above-mentioned problem.

In the carrying device 15c of this embodiment, a link 8d, which is rotatable around a pivot 2 integrally with a link 8b, is fitted to a fixedly connected portion 8c of an L type arm 8; and further, a link 30, which is rotatable around a pivot 1 integrally with a link 10, is fitted.

Here, the fitting angle of the link 30 to the link 10 and the fitting angle of the link 8d to the link 8b are set at the same magnitude ($\theta_5$).

Further, a link 9d is fitted rotatably to an end 33 of the link 8d on a side opposite to the pivot 2 and an end 34 of the line 30 on a side opposite to the pivot 1. The length of this link 9d is the same as that of the arm 7a. (The distances between the pivots are the same.)

A third parallelogram linkage 31 is formed by the link 8d, the link 9d, the link 30 and the arm 7a. The other configuration is the same as that of the carrying mechanism 15 shown in FIG. 12; and thus, an explanation thereof is omitted.

In the carrying mechanism 15c of this embodiment, each of the fitting angle $\theta_5$ of the link 30 to the link 10 and the fitting angle $\theta_5$ of the link 8d to the link 8b is about 60°, but it is desired to set them at an optimal fitting angle, depending upon the configuration of the apparatus, movable ranges, etc.

Particularly when the fitting angle $\theta_5$ of the link 30 to the link 10 and the fitting angle $\theta_5$ of the link 8d to the link 8b are small, the dead-point position of the first parallelogram linkage 13 and that of the third parallelogram linkage 31 approach each other, so that the links cannot pass in a stable manner through the dead-point positions. From this point of view, the fitting angle $\theta_5$ is preferably about 30° to about 60°.

The operating principle of the carrying device 15c of this embodiment will be explained by using FIG. 22.

FIG. 22 shows a state in which the arm 7a, the link 10, the link 9a and the link 8b are in a straight line similarly with the case shown in FIG. 21. (For facilitating the understanding of the positional relationship among the links, the pivots 2 and 4 are divided into two in FIG. 22.)

In FIG. 22, when the arm 7a is rotated around the pivot 1 in the CW direction, the link 10 rotates in the CCW direction through the action of the pivot moving mechanism 12 similarly with the case of the carrying mechanism 15a shown in FIG. 21. However, since the rotating direction of the link 8b cannot be forcibly determined, whether the link 8b rotates around the pivot 2 in either the CW or CCW direction is not determined.

In the case of this embodiment, however, since the link 30 rotates around the pivot 1 in the CCW direction integrally with the movement of the link 10, the link 8d constituting the third parallelogram linkage 31 rotates around the pivot 2 in the CCW direction.

As a result, since the link 8b rotates around the pivot 2 in the CCW direction integrally with the link 8d, the link 8b can get out of the dead-point position.

Similarly, when the link 8d, the link 9d, the link 30 and the arm 7a constituting the third parallelogram linkage 31 come in a straight line (the dead-point position), the link 8d can get out of the dead-point position through the movements of the link 8b, the link 9a, the link 10 and the arm 7a constituting the first parallelogram linkage 13.

As such, according to this embodiment, the arm 8a can rotate around the pivot 2 in a stable manner, while the rotating direction does not become unstable at the dead-point position.

Figure 23:
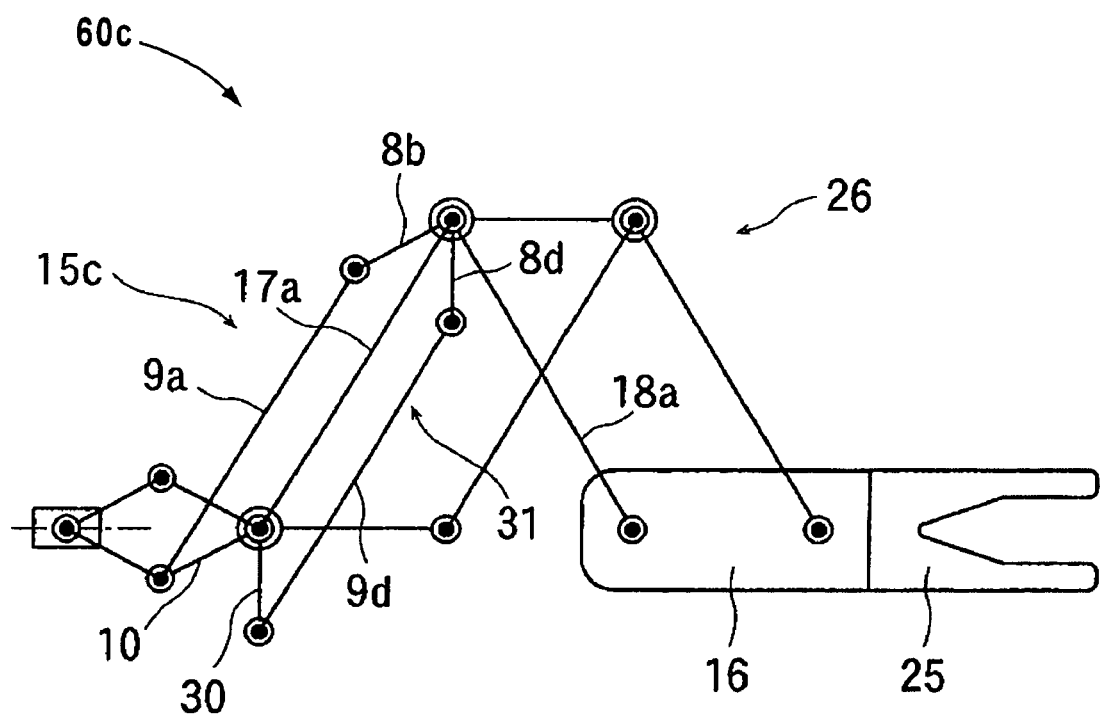
FIG. 23 is a schematic configuration diagram of another embodiment of the carrying mechanism according to the first invention.

FIG. 23 is a schematic configuration diagram showing another embodiment of the carrying device of the first invention, and the carrying device is based on a parallel link type arm mechanism.

As shown in FIG. 23, the carrying device 60c of this embodiment uses the above-mentioned carrying mechanism 15c, and possesses the above parallel link type arm mechanism 26.

Here, the configurations of an upper arm linkage 27 and a lower arm linkage 28 of the parallel link type arm mechanism 26, a carrying table 16 and an end effector 25 are the same as those in the carrying device 60a shown in FIG. 14, and thus an explanation thereof is omitted.

Further, the carrying mechanism 15c is configured such that the arm 7a illustrated in FIG. 22 corresponds to an upper arm 17a, and the arm 8a corresponds to a lower arm 18a. Meanwhile, the configurations of the other parts of the carrying device 15c are the same as what are illustrated in FIG. 22, and thus an explanation thereof is omitted.

The motions of the carrying device 60c of this embodiment are the same as those of the above-mentioned carrying device shown in FIG. 14 except for those of the above-mentioned carrying mechanism 15c. The motions of the parts of the carrying mechanism 15c are as illustrated in FIG. 22. Therefore, a detailed explanation of the extending and retracting motions and the rotating motions of this embodiment is omitted.

As explained above, according to the carrying device 60c of this embodiment, similarly with the above embodiments, the rotating motion of the upper arm 17a is transmitted to the lower arm 18a, and the lower arm 18a rotates by an angle twice as large as the rotating angle of the upper arm 17a. Therefore, the motion of the upper arm linkage 27 is accurately transmitted to the lower arm linkage 28.

In this way, according to this embodiment, similarly with the above embodiments, any dust (such as, metal dust) is not produced in a sliding portion like in the above embodiments, so that the contamination of semiconductor wafers or the like as objects to be carried can be prevented; and the objects can be carried to the correct position by accurately transmitting the power between the upper arm linkage 27 and the lower arm linkage 28.

Further, in this embodiment, a third parallelogram linkage 31 is configured such that it shares the upper arm 17a constituting a first parallelogram linkage 13, the lower arm 18a stably rotating around the pivot 2 without its rotation becoming unstable at the dead-point position. As a result, the lower arm linkage 28 can be stably moved beyond the dead-point position.

Figure 18:
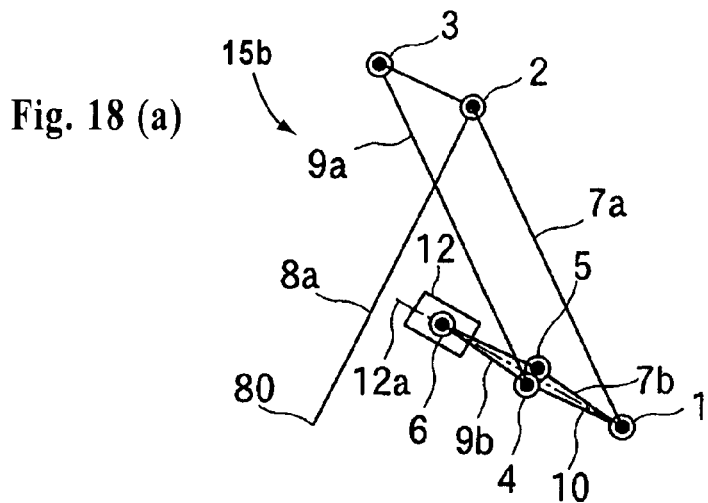
FIGS. 18(*a*) to (*c*) are schematic configuration diagrams showing the configurations and extending and retracting motions of another embodiment of the carrying mechanism according to the first invention.
Figure 18:
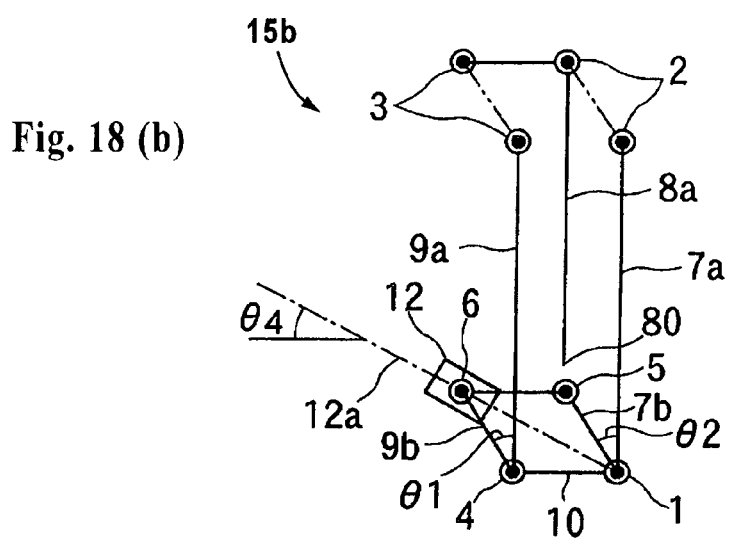
Figure 18:
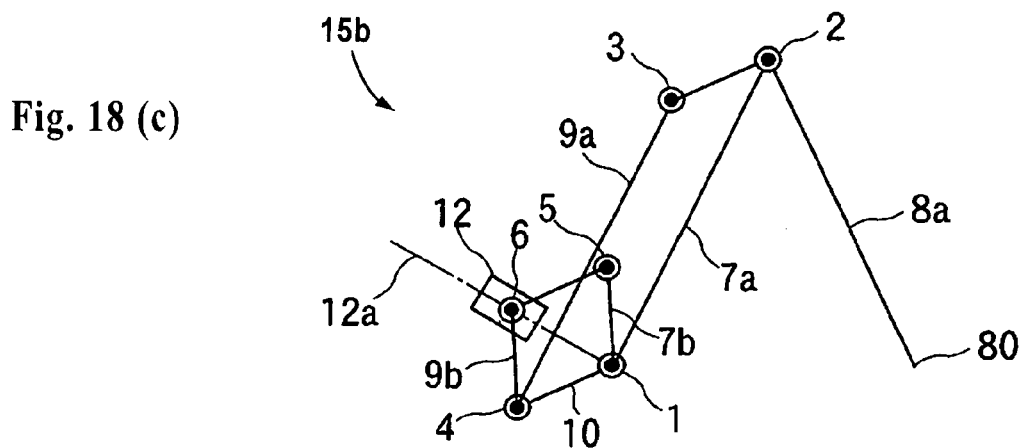

Meanwhile, in the carrying mechanism 15c of this embodiment, its pivot moving mechanism 12 is arranged in the same manner as that illustrated in FIG. 12 such that it is fitted at an angle of 0° relative to the extending and retracting directions of the carrying table 16, but the pivot moving mechanism can be configured such that it is fitted at an angle other than 0° relative to the extending and retracting directions of the carrying table 16, like the embodiment illustrated in FIG. 18. In this case, neither of the arm 8a or the lower arm 18a has a problem in the movement at the dead-point position.

Next, an embodiment of the second invention will be explained with reference to the figures. It is noted that an explanation is omitted for the portions overlapping the above explanation, unless particularly necessary.

Figure 24:
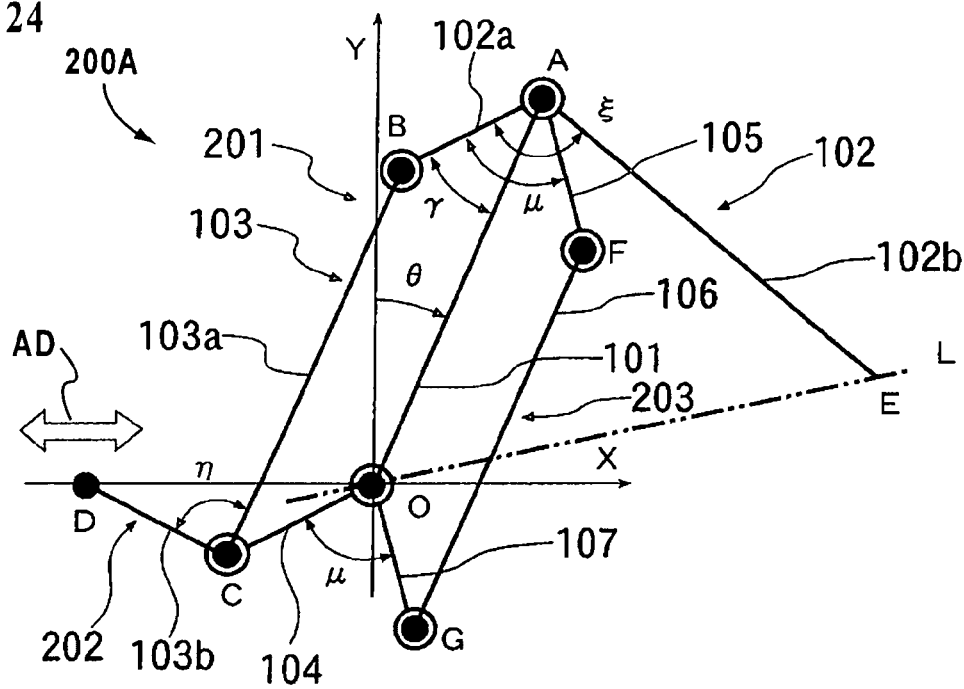
FIG. 24 is a schematic diagram showing the basic configuration of an embodiment of the carrying mechanism according to the second invention.
Figure 25:
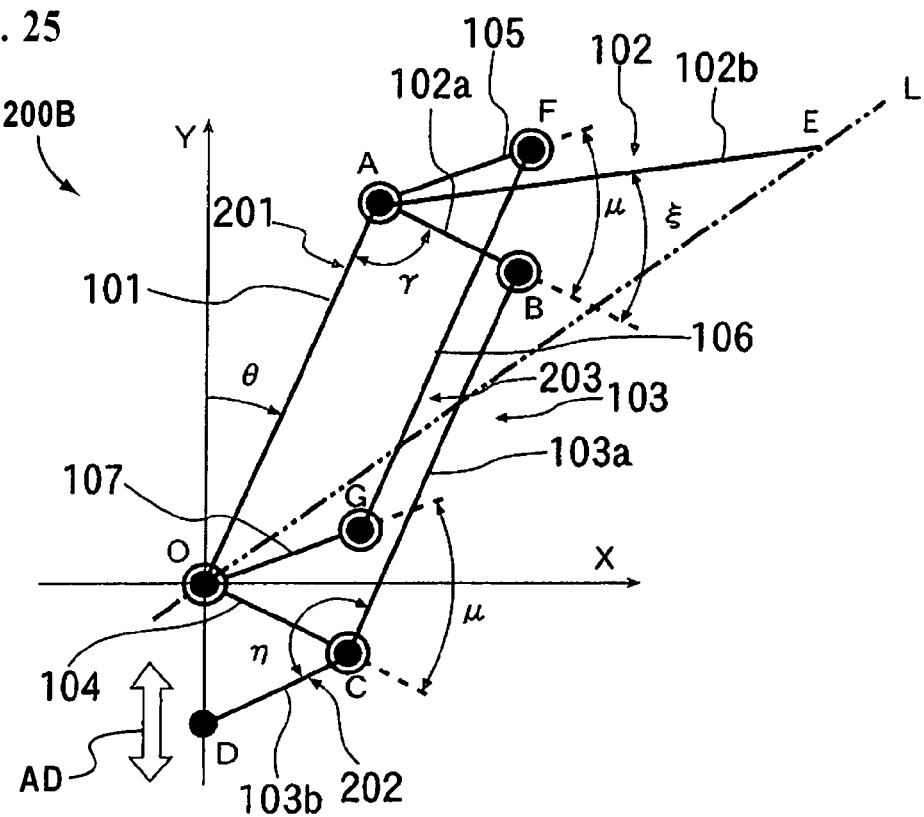
FIG. 25 is a schematic view showing the basic configuration of an embodiment of the carrying mechanism according to the second invention.

FIGS. 24 and 25 are schematic views showing the basic configuration of the embodiment of the carrying mechanism according to the second invention.

Figure 7:
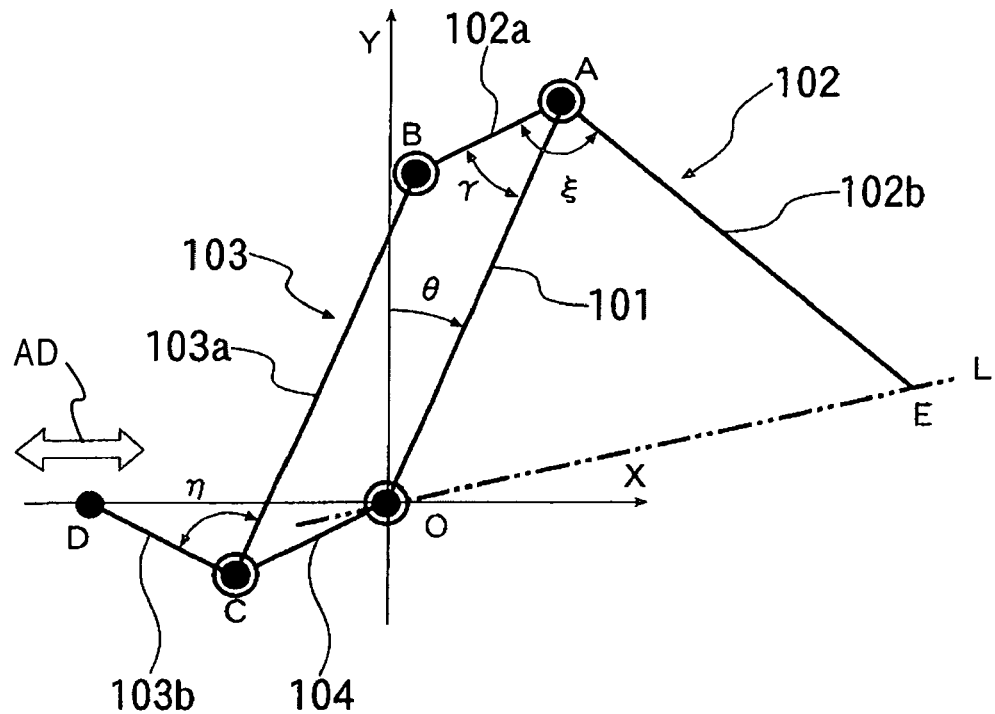
FIG. 7 is a schematic configuration diagram showing the operating principle of the carrying mechanism according to the second invention (Framing conditions [3]).
Figure 8:
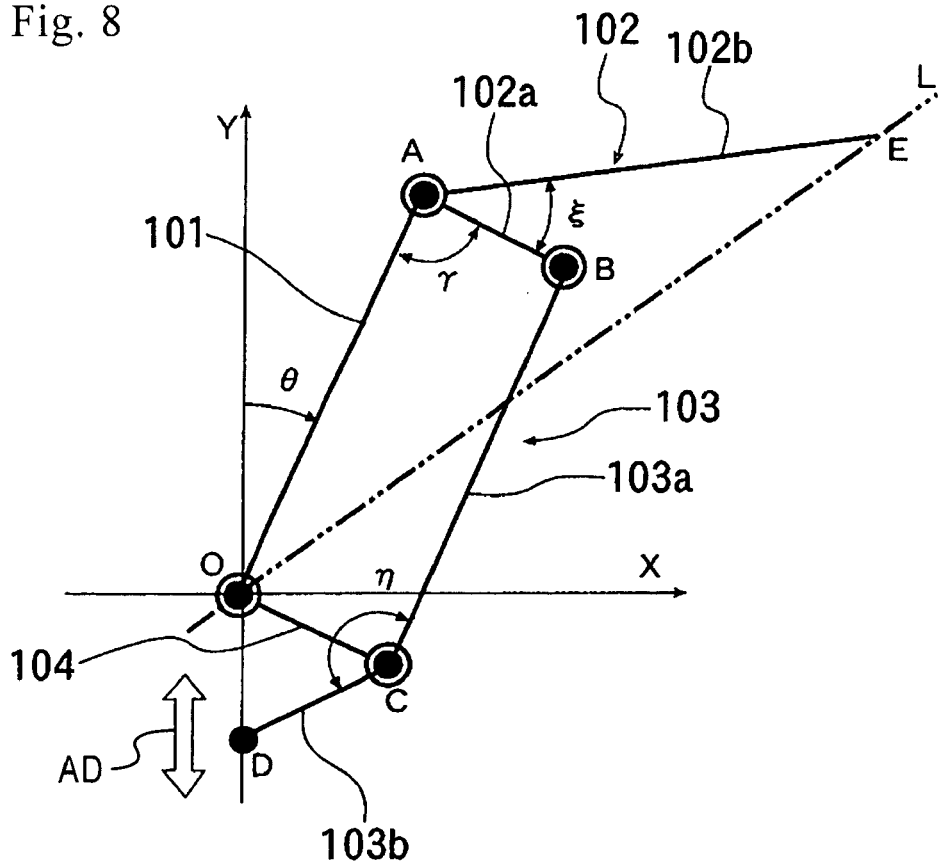
FIG. 8 is a schematic configuration diagram showing the operating principle of the carrying mechanism according to the second invention (Framing conditions [3]).
Figure 9:
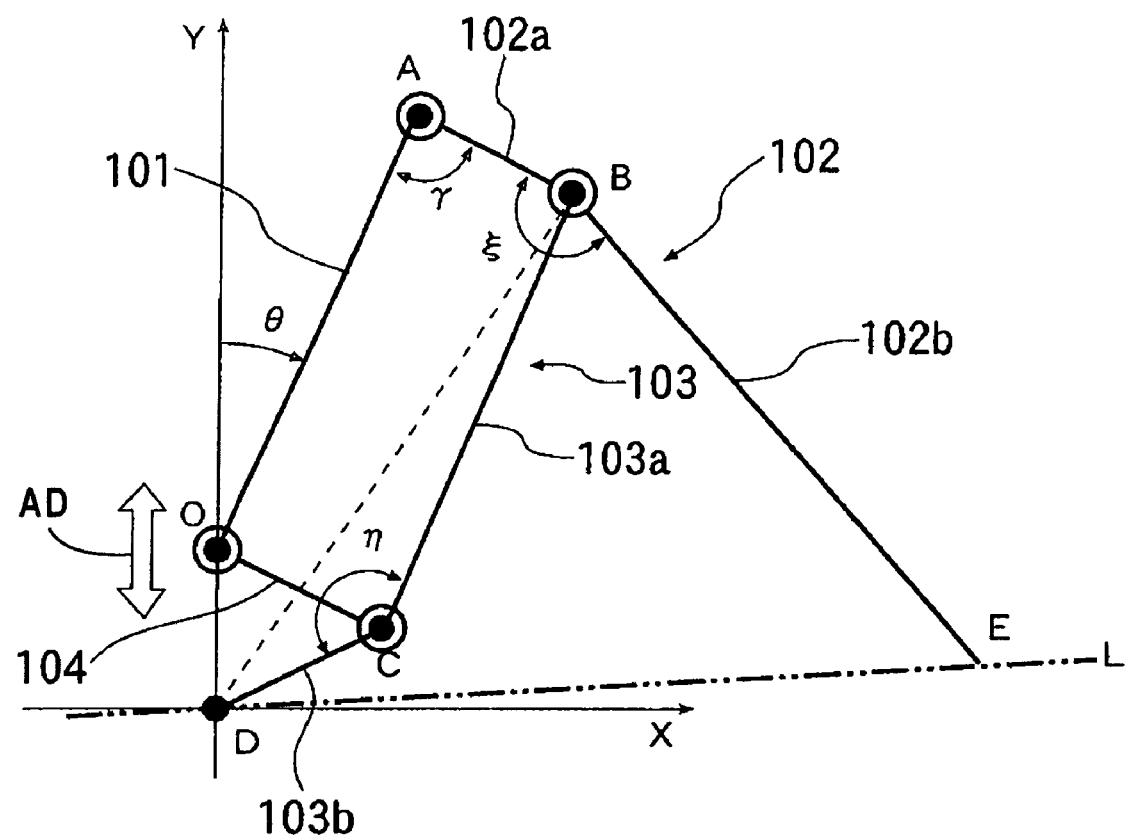
FIG. 9 is a schematic configuration diagram showing the operating principle of the carrying mechanism according to the second invention (Framing conditions [3]).
Figure 10:
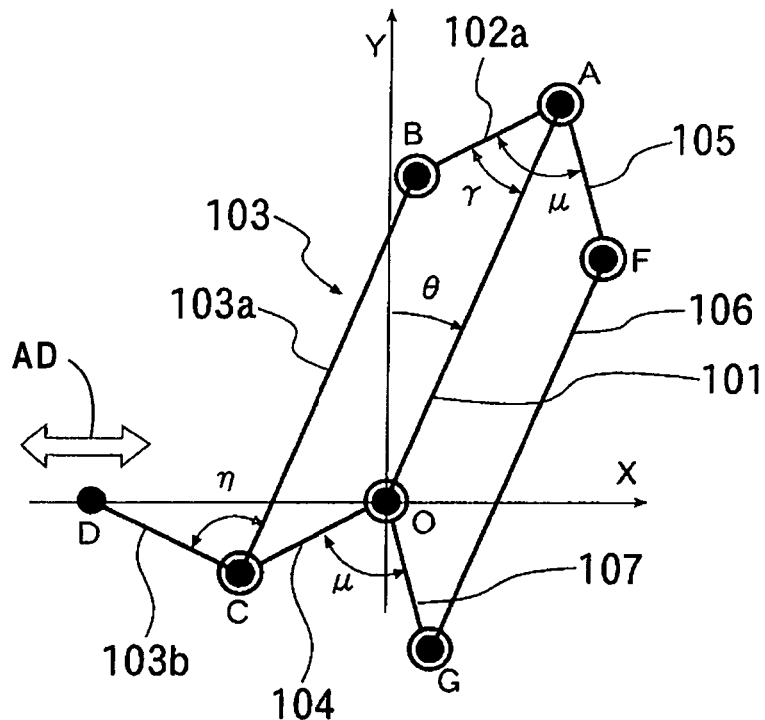
FIG. 10 is a schematic configuration diagram showing the operating principle of the carrying mechanism according to the second invention (Framing conditions [4]).
Figure 11:
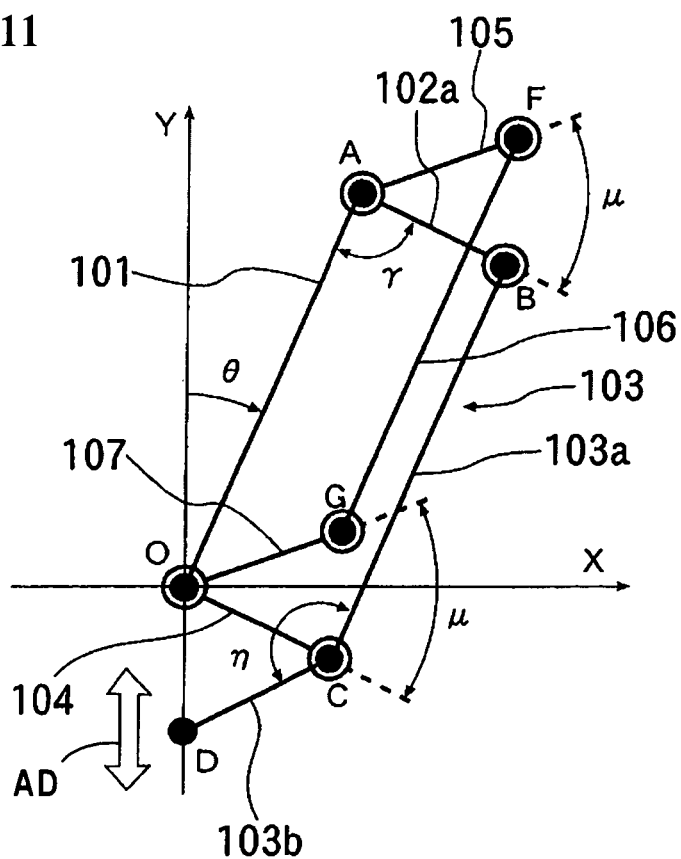
FIG. 11 is a schematic configuration diagram showing the operating principle of the carrying mechanism according to the second invention (Framing conditions [4]).

The carrying mechanism 200A of this embodiment incorporates all the above-described basic configurations [1] to [4], wherein, for example, a third link mechanism is added to the configuration shown in FIG. 7 or FIG. 8.

Here, a link 101, a link 102a, a link 103a and a link 104 are connected rotatably around pivots O, A, B and C, thereby constructing a first link mechanism 201 as a parallelogram link mechanism.

Further, a link 103b as a second restrained link is fixedly restrained at a pivot C by an arbitrary angle ($\eta = \angle BCD$) relative to the link 103a as a first restrained link. These links 103a and 103b are integrated around the pivot C, and rotate as an L type arm 103.

This link 103b is equal to a common link 104 in length, and connected rotatably around a pivot D, so that a second link mechanism 202 is formed by these links 103b and 104.

Further, an arm 102b as a carrying arm member, which is equal to the link 101 in length, is fixedly restrained at a pivot A at an arbitrary angle ($\xi$) relative to the link 102a. The link 102a and the arm 102b are integrated around the pivot A and rotate as an L type arm 102.

Further, a link 105 and a link 107 are connected rotatably around a pivot A and a pivot O at both ends of the link 101 of the first link mechanism 201, and a link 106 is connected rotatably around a pivot F of an end of the link 105 and a pivot G of an end of the link 107, thereby forming a third link mechanism 203, as a parallelogram link mechanism, which is formed of links equal to those of the first link mechanism 201 in length.

Here, the link 105 is fixedly restrained at a certain angle ($\angle$BAF) relative to the link 102a, and the link 107 is fixedly restrained at a certain angle ($\angle$COG) relative to the link 104. In addition, the angle ($\angle$BAF) formed by the link 105 and the link 102a and the angle (∠COG) formed by the link 107 and the link 104 are equal and are other than 0° and 180° (μ=∠BAF=∠COG, μ≠0, 180°).

Moreover, the angle μ is desirably the most optimal fitting angle, depending upon the configuration of the apparatus, movable ranges, etc. If the angle μ is too small, the dead-point positions of first link mechanism 201 and the third link mechanism 203 approach each other, and the links may not stably pass the dead-point positions. From this point of view, the angle μ is preferably 30° to 60°.

In the carrying mechanism 200A of this embodiment, when the link 101 or the link 104 is rotated around the pivot O or when the link 103b is rotated around the pivot D, the tip (E) of the arm 102b moves on a straight line (L) connecting the tip (E) of this arm 102b and the pivot O.

Moreover, according to this embodiment, since the third link mechanism 203 is provided and the links can get out of the dead-point positions as in the case of the embodiments shown in FIG. 21 and FIG. 22. Therefore, the arm 102b can rotate in a stable manner around the pivot A without its rotating direction being unstable at the dead-point position.

Figure 26:
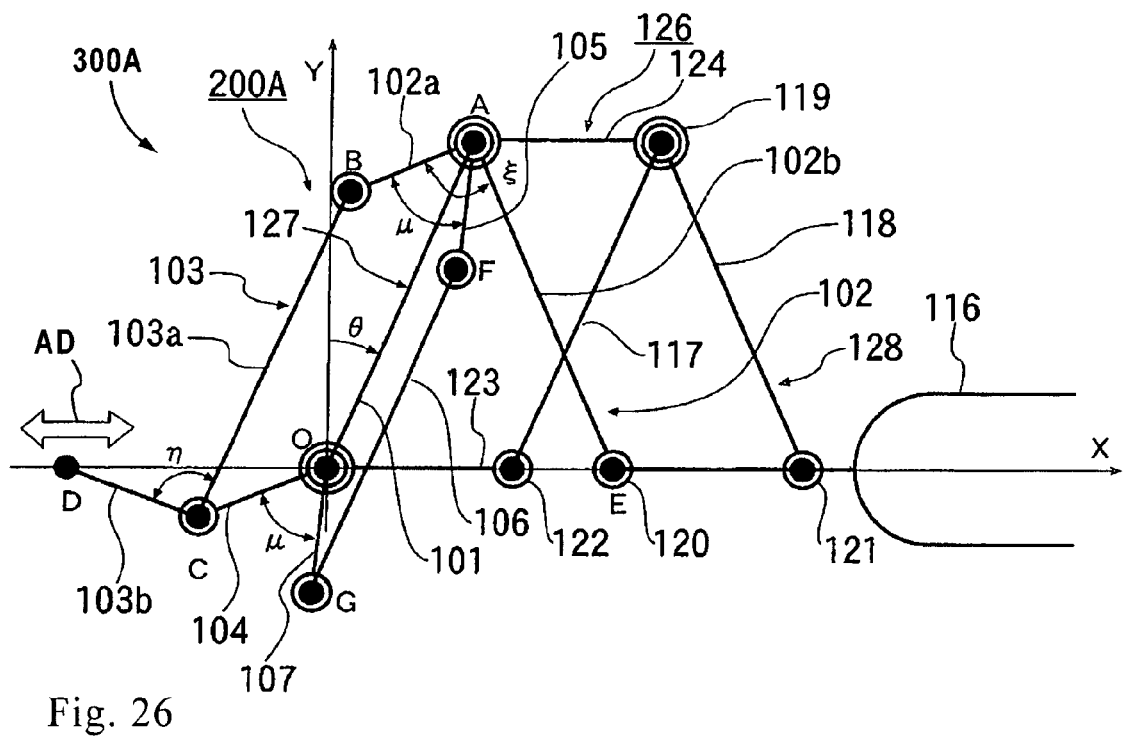
FIG. 26 is a schematic configuration view showing an embodiment of the carrying mechanism according to the second invention.
Figure 27:
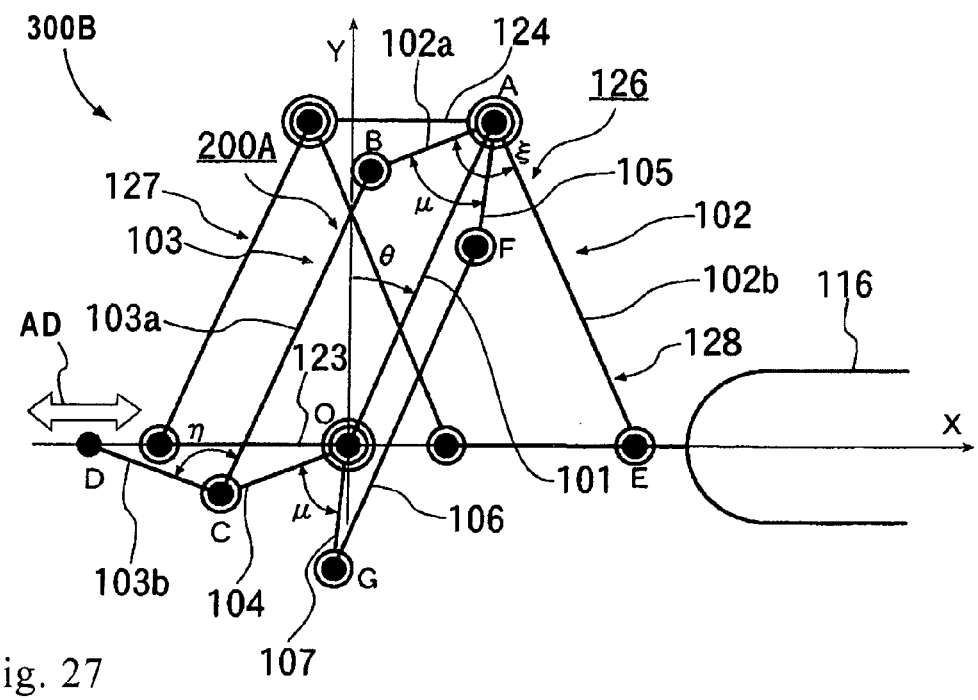
FIG. 27 is a schematic configuration view showing an embodiment of the carrying mechanism according to the second invention.
Figure 28:
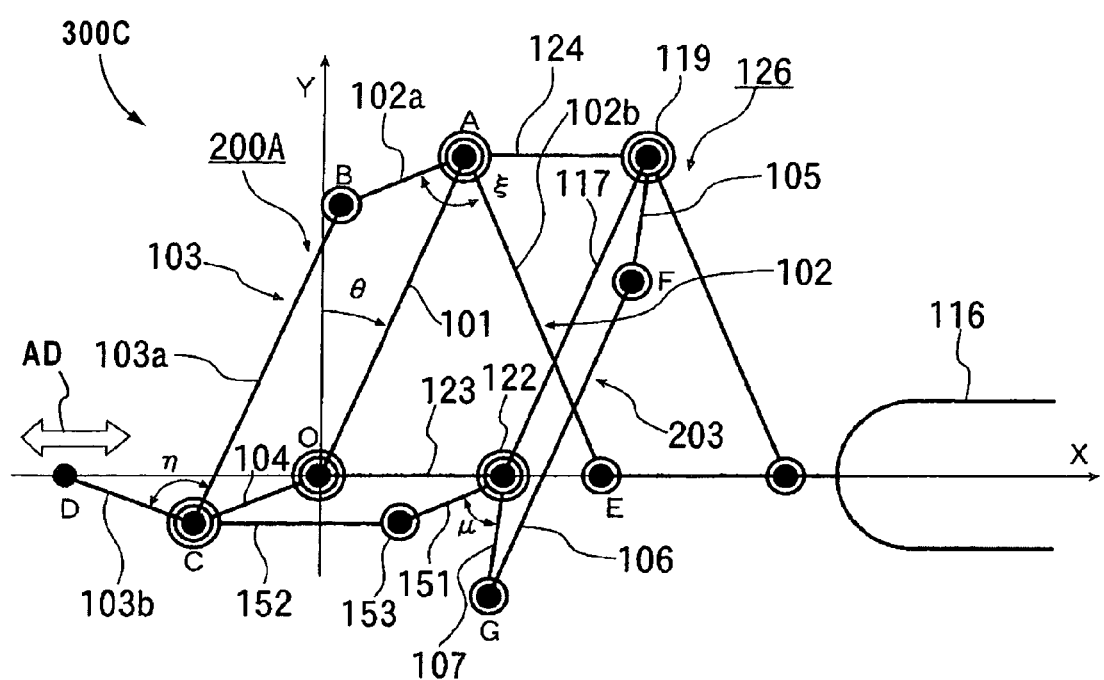
FIG. 28 is a schematic configuration view showing an embodiment of the carrying mechanism according to the second invention.

FIG. 26 to FIG. 28 are schematic configuration diagrams showing embodiments of the carrying device according to the second invention, which is a carrying device using the above-mentioned carrying mechanism 200A and a parallel link type arm mechanism.

Here, the carrying devices 300A and 300B shown in FIGS. 26 and 27 are configured such that η=90°, μ=60° and ξ=90° in the carrying device 200A, as shown in, for example, FIG. 24.

In the following descriptions, the carrying device 300A shown in FIG. 26 is explained by way of example. This carrying device 300A has a parallel link type arm mechanism 126 similar to the parallel link type arm mechanism 26 shown in FIG. 14.

The parallel link type arm mechanism 126 is constructed by an upper arm linkage 127 which is formed by upper arms and links respectively opposed in parallel and a lower arm linkage 128 which is formed by lower arms, a link and a carrying table respectively opposed in parallel.

An upper side arm of the upper arm linkage 127 corresponds to the above link 101, the links 123 and 124 are fitted rotatably to pivots O and A of both ends thereof, respectively, and the link 117 is fitted rotatably to pivots 122 and 119 on a side opposite to the pivots O and A of the links 123 and 124.

Here, the pivot 122 is provided on an extension of a straight line (X axis) connecting the pivot D and the pivot O.

Further, the lower arm of the lower arm linkage 128, which corresponds to the above arm 102b, is fixedly connected to the above link 102a, and the fixedly connecting portion is fitted rotatably to the pivot A.

And, the lower arm 118 opposed to the arm 102b is fitted rotatably to the pivot 119 of the upper arm linkage 127, and these arms 102b, 118 are fitted rotatably to pivots 120, 121 connected to the carrying table 116.

In this embodiment, the length (distance between the pivots) of each of the links 123, 124 is configured to be equal to the distance between the pivots (the length between the pivots 120, 121) of the carrying table 116. The lengths of the link 101, the arm 102b and the arm 118 (distances between the pivots) are configured to be all equal.

The motions of the carrying devices 300A, 300B of this embodiment are the same as those of the carrying device 60c shown in FIG. 23, except for those of the above-mentioned carrying mechanisms 200A, 200B, and the motions of the parts of the carrying mechanism 200A are as described above.

The configurations of the carrying devices 300A and 300B shown in FIG. 26 and FIG. 27 differ merely in that the link 101 and the arm 102b of the mechanism shown in FIG. 26 are fitted to the ends of the links 124, 123, on either side, of the upper arm linkage 127 of the parallel link type arm mechanism 126. Therefore, the extending and retracting motions of the parallel link type arm mechanism 126 are the same when the link 101 is rotated around the pivot O.

On the other hand, FIG. 28 is a schematic configuration diagram showing another embodiment of the carrying device according to the second invention.

In the carrying device 300C shown in FIG. 28, the fitting position of the third link mechanism explained in the above-described framing conditions [4] is changed.

That is, in the carrying device 300C, different from the configuration shown in FIG. 26, a third link mechanism 203 formed by links 105, 106, 107 and 117 is fitted to the ends (pivots 119, 122) of the links 124, 123, on the opposite side, of the upper arm linkage 127 of the parallel link type arm mechanism 126.

Further, in this embodiment, the link 107 and the link 151 are fixedly restrained around the pivot 122 at an angle μ, ends of the link 152 are fitted rotatably to the pivot C and the pivot 153, respectively, and further one end of the link 151 is fitted rotatably to the pivot 153.

In this embodiment, the extending and retracting motions of the parallel link type arm mechanism 126 are also the same, when the link 101 is rotated around the pivot O.

Figure 29:
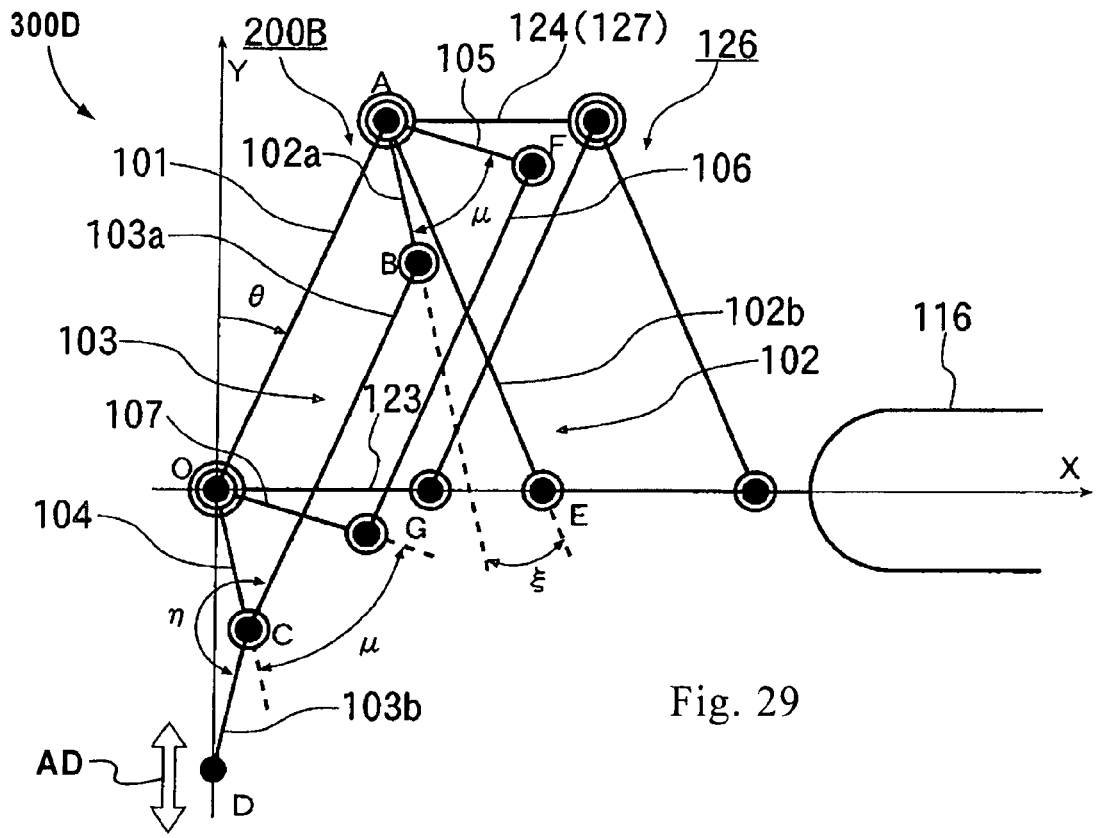
FIG. 29 is a schematic configuration view showing another embodiment of the carrying mechanism according to the second invention.
Figure 30:
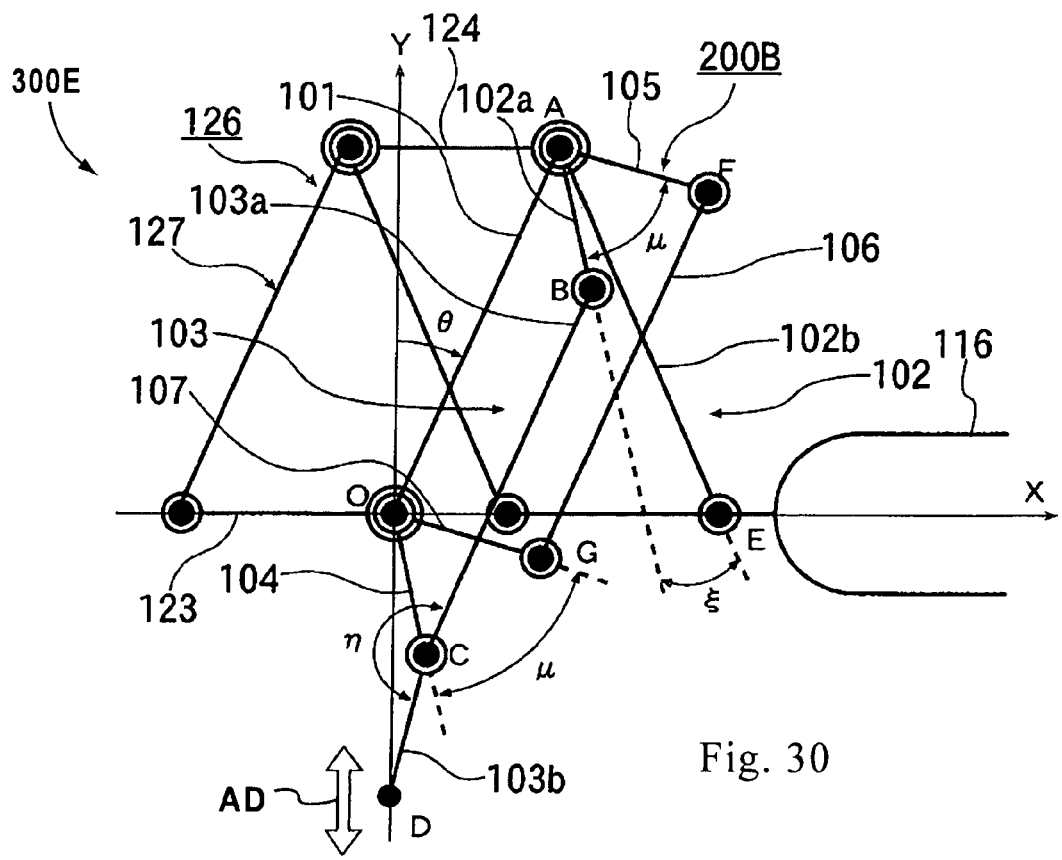
FIG. 30 is a schematic configuration view showing another embodiment of the carrying mechanism according to the second invention.
Figure 31:
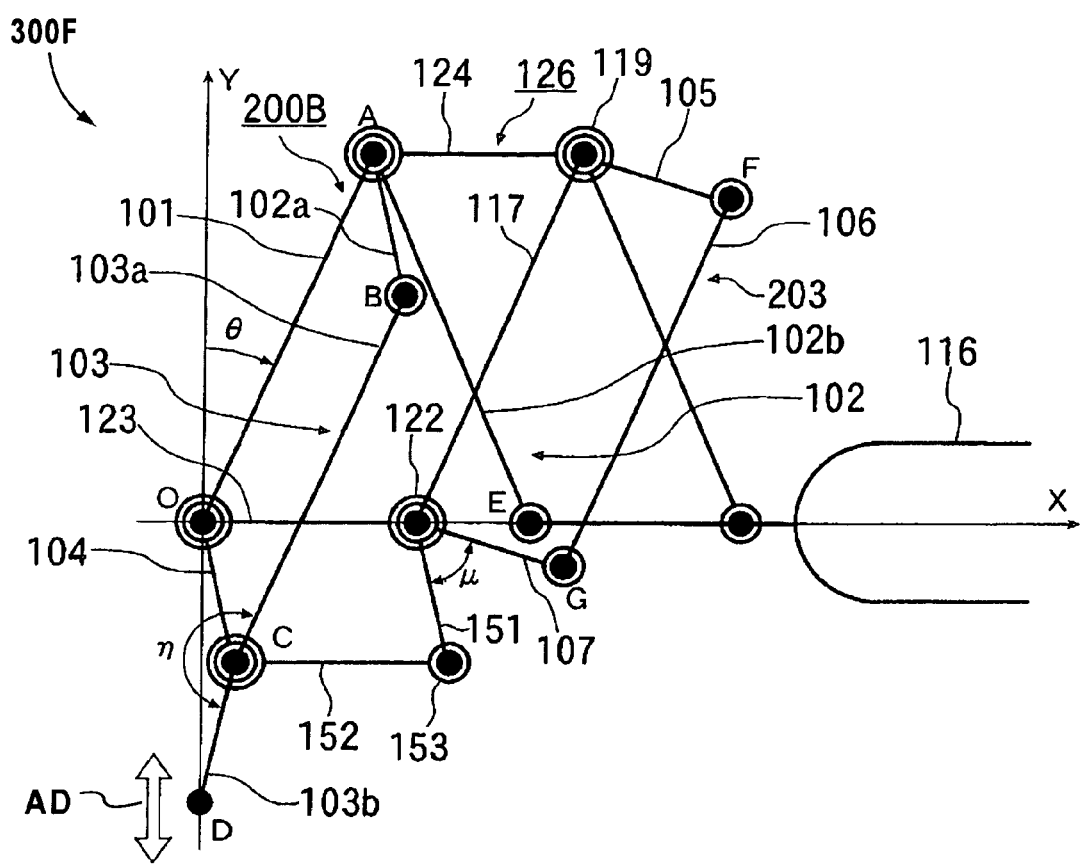
FIG. 31 is a schematic configuration view showing another embodiment of the carrying mechanism according to the second invention.

FIG. 29 to FIG. 31 are schematic configuration diagrams showing other embodiments of the carrying device according to the second invention, which is a carrying device using the above-mentioned carrying mechanism 200B and the parallel link type arm mechanism 126.

Here, the carrying devices 300D and 300E shown in FIGS. 29 and 30 are configured such that η=210°, μ=60° and ξ=10° in the carrying mechanism 200B, as shown in, for example, FIG. 25. Thus, the motions of the carrying mechanism 200B are as described above.

The configurations of the carrying devices 300D and 300E shown in FIG. 29 and FIG. 30 differ merely in that the carrying mechanism 200B is fitted to the ends of the links 124, 123, on either side, of the upper arm linkage 127 of the parallel link type arm mechanism 126. Therefore, the extending and retracting motions of the parallel link type arm mechanism 126 are the same as in the above-described embodiments when the link 101 is rotated around the pivot O.

In the carrying device 300F shown in FIG. 31, the fitting position of the third link mechanism explained in the above-described framing conditions [4] is changed.

That is, in the carrying device 300F, different from the configuration shown in FIG. 29, a third link mechanism 203 formed by links 105, 106, 107 and 117 is fitted to ends (pivots 119, 122) of the links 124, 123, on the opposite side, of the upper arm linkage 127 of the parallel link type arm mechanism 126.

Further, in this embodiment, the link 107 and the link 151 are fixedly restrained around the pivot 122 at an angle μ; the ends of the link 152 are fitted rotatably to the pivot C and the pivot 153, respectively; and a further end of the link 151 is fitted rotatably to the pivot 153.

In this embodiment, the extending and retracting motions of the parallel link type arm mechanism 126 are also the same when the link 101 is rotated around the pivot O.

In the above embodiments, the link 102a, the arm 102b, the link 104, the link 105 and the link 107 are separate members. According to the present invention, however, in the carrying device 300D shown in, for example, FIG. 29, the links 104 and 107 may be formed as a single member, and the links 102a and 105 may be formed as a single member.

Here, when η=180°, μ=30° and ξ=0°, it is possible that the pivot B is disposed on the arm 102b and the arm 102b and the link 105 can be formed as a single member.

As has been described above, in the embodiments of the second invention, any dust (such as, metal dust) is not produced in a sliding portion, so that the contamination of the semiconductor wafers or the like as objects to be carried can be prevented; and the objects can be carried to the correct position by accurately transmitting the power between the upper arm linkage 127 and the lower arm linkage 128.

Figure 32:
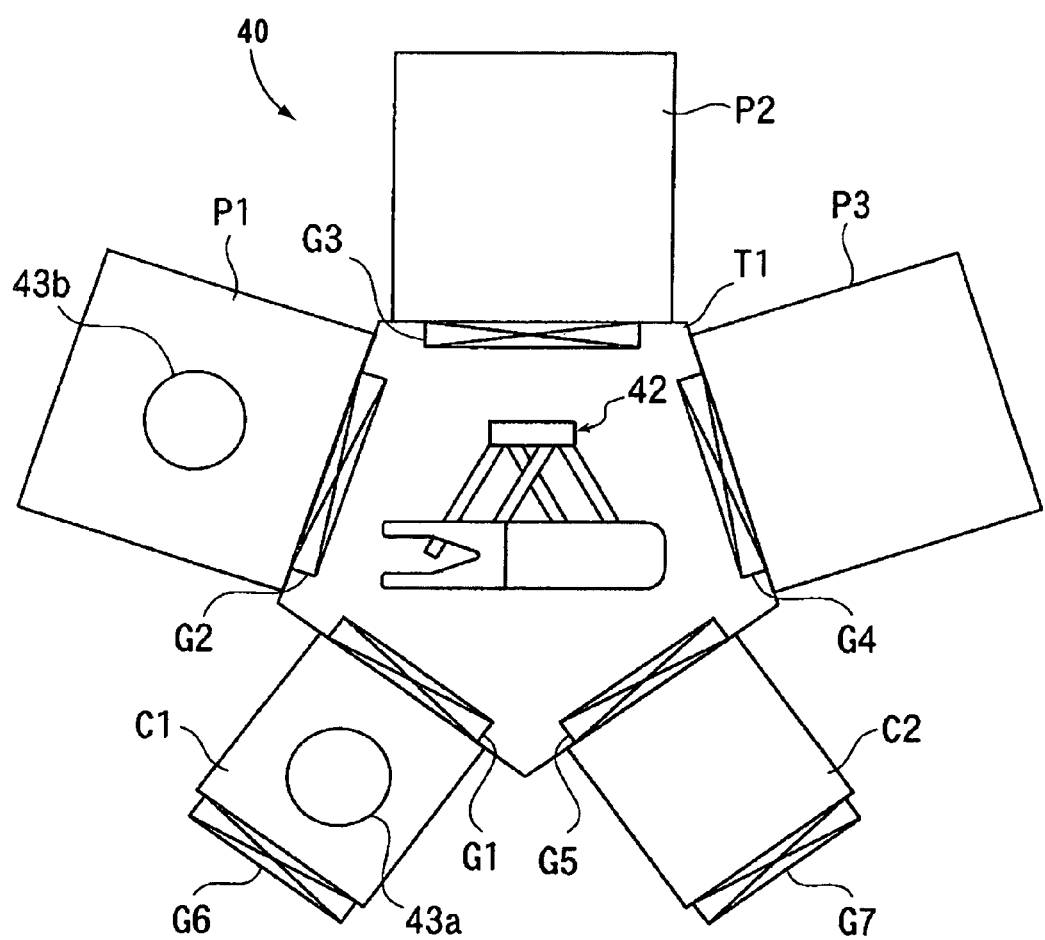
FIG. 32 is a plan view schematically showing the configuration of an embodiment of a vacuum processing apparatus equipped with the carrying device according to the present invention.
Figure 33:
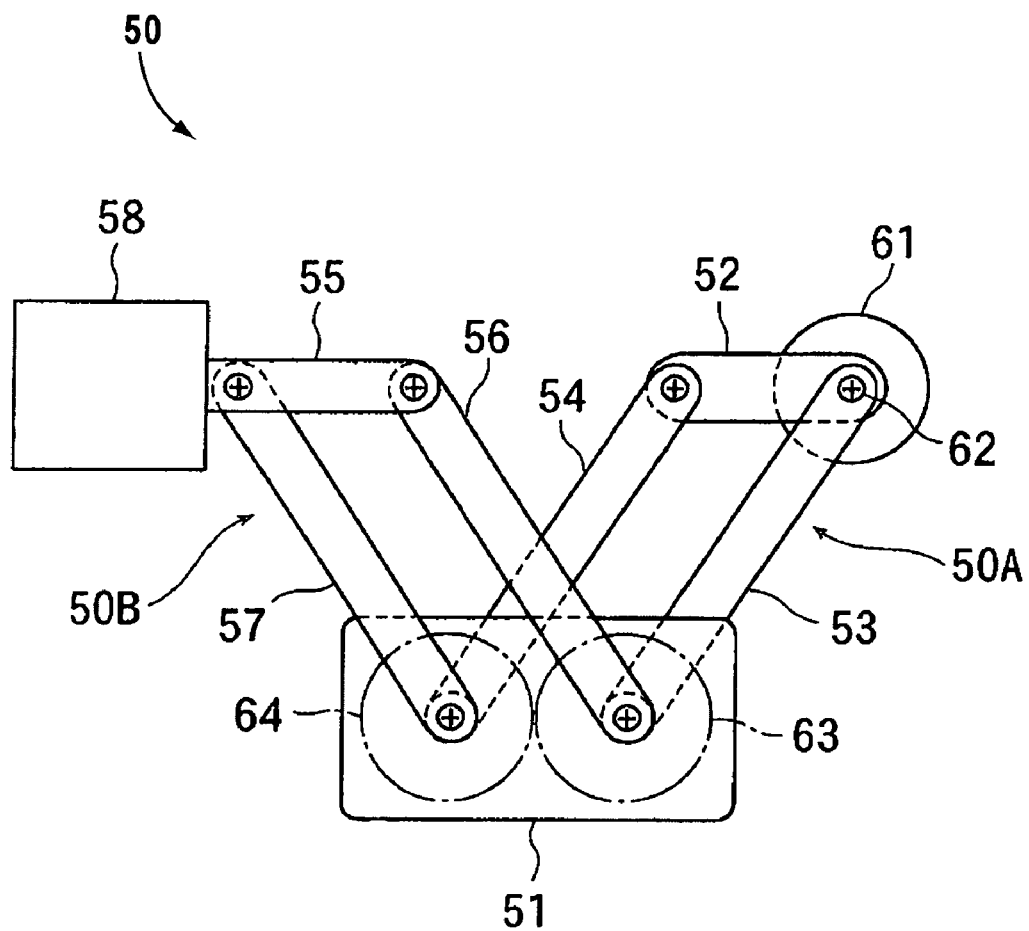
FIG. 33 is a plan view showing the schematic configuration of a conventional carrying device.

FIG. 32 is a plan view schematically showing the configuration of an embodiment of a vacuum processing apparatus equipped with the carrying device according to the present invention.

As shown in FIG. 32, in the vacuum processing apparatus 40 of this embodiment, three processing chambers P1, P2, P3 capable of performing processing in parallel, a carry-in chamber C1 for carrying a wafer 43 (43a, 43b) thereinto, and a carry-out chamber C2 for carrying out the wafer 43 are disposed around a carrying chamber T1 having the carrying device 42 according to the present invention as described above.

These processing chambers P1 to P3, the carry-in chamber C1 and the carry-out chamber C2 are connected to a vacuum exhaust system (not shown) therebetween; and the carrying chamber T1 are provided gate valves G1 to G5, respectively, which are opened and closed when wafers 43 are exchanged.

Further, the carry-in chamber C1 is provided with a gate valve G6 which is opened and closed when the wafer 43 is carried in from outside the apparatus; and the carry-out chamber C2 is provided with a gate valve G7 which is opened and closed when the wafer is carried to the outside of the apparatus.

In the vacuum processing apparatus 40 having such a configuration, the above carrying device 42 takes out a non-processed wafer 43a stored in the carry-in chamber C1, and holds and carries it to the processing chamber P1, for example.

At this time, the carrying device 42 performs the above-described motions, thereby receiving a processed wafer 43b from the processing chamber P1 and carrying it to other processing chambers P2, P3.

Then, non-processed wafers 43a and processed wafers 43b are similarly transferred among the processing chambers P1 to P3, the carry-in chamber C1 and the carry-out chamber C2 by using the carrying device 42.

According to this embodiment having such a configuration, it is possible to provide a vacuum processing apparatus that can prevent contamination of the objects to be carried and contribute to improved throughput by carrying the objects to the correct positions.

Meanwhile, the present invention is not limited to the above-mentioned embodiments, and various modifications can be made.

For instance, in the above embodiments of the first invention, the length of the arm 8a as the carrying arm member is made equal to the length of the link 7a as the first restrained link, but the present invention is not limited thereto. The arm 8a and the link 7a can be made different in length.

However, the configuration as in the above embodiments is preferable in order to linearly move the tip 80 of the arm 8a.

In addition, the angle formed between the arm 8a and the link 8b can be other than 90°.

Figure 2:
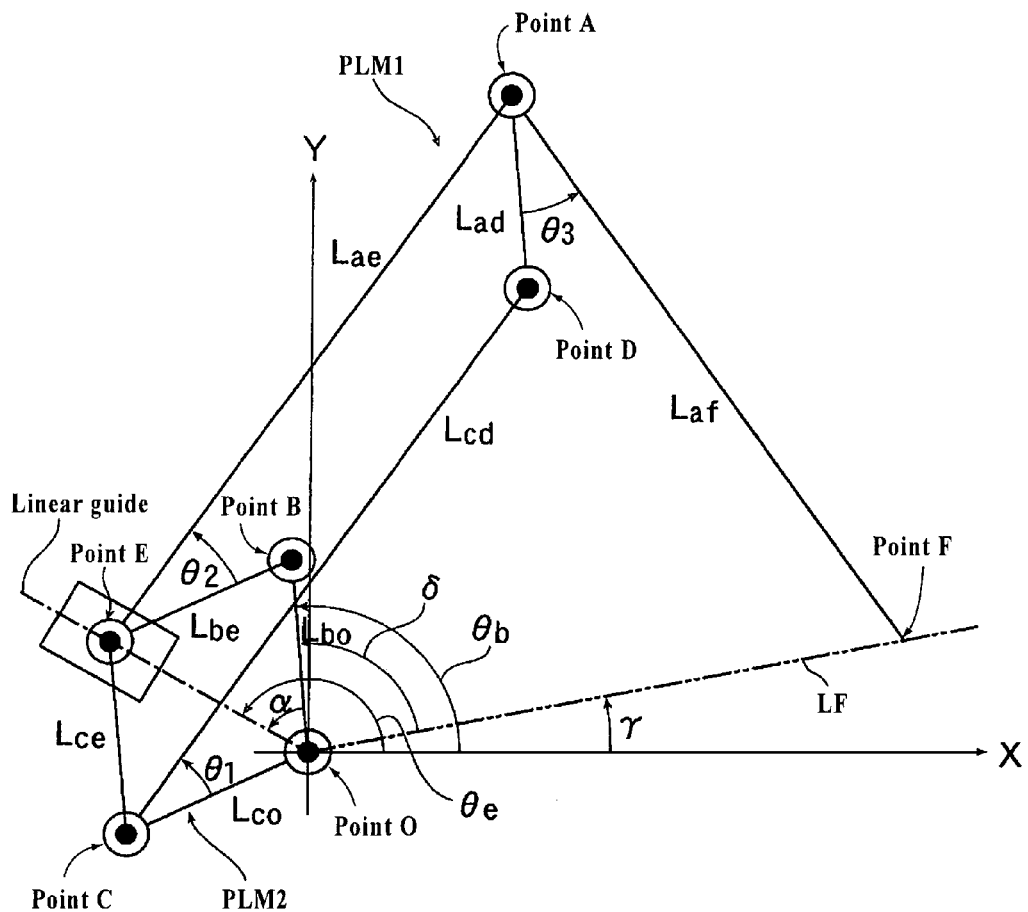
FIG. 2 is a second schematic configuration diagram showing the operating principle of the carrying mechanism according to the first invention.
Figure 3:
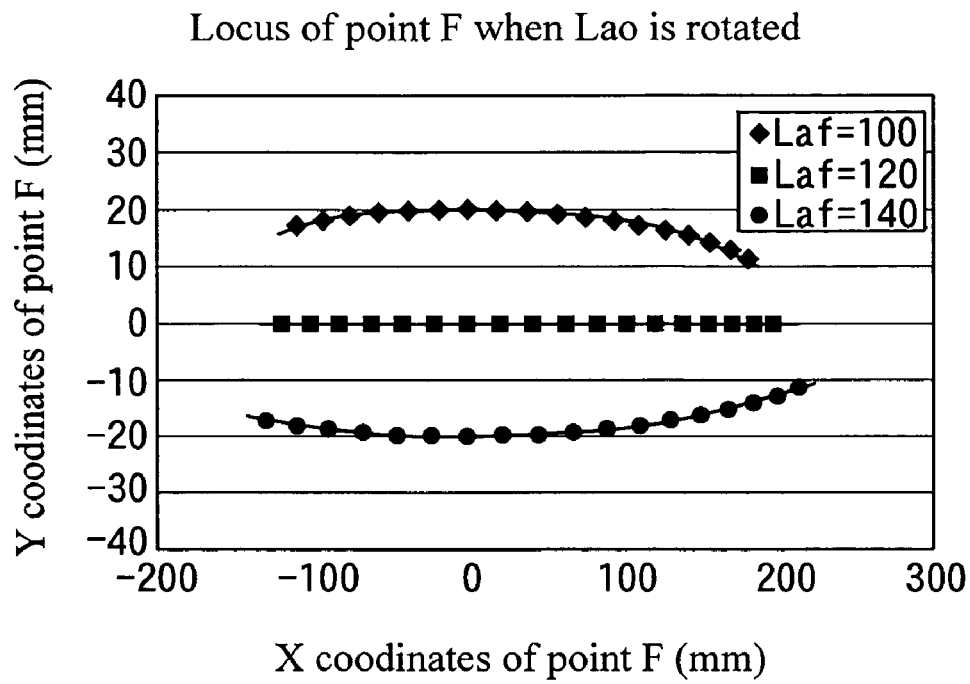
FIG. 3 is a graph showing the locus of the point F in the carrying mechanism of FIG. 1.
Figure 4:
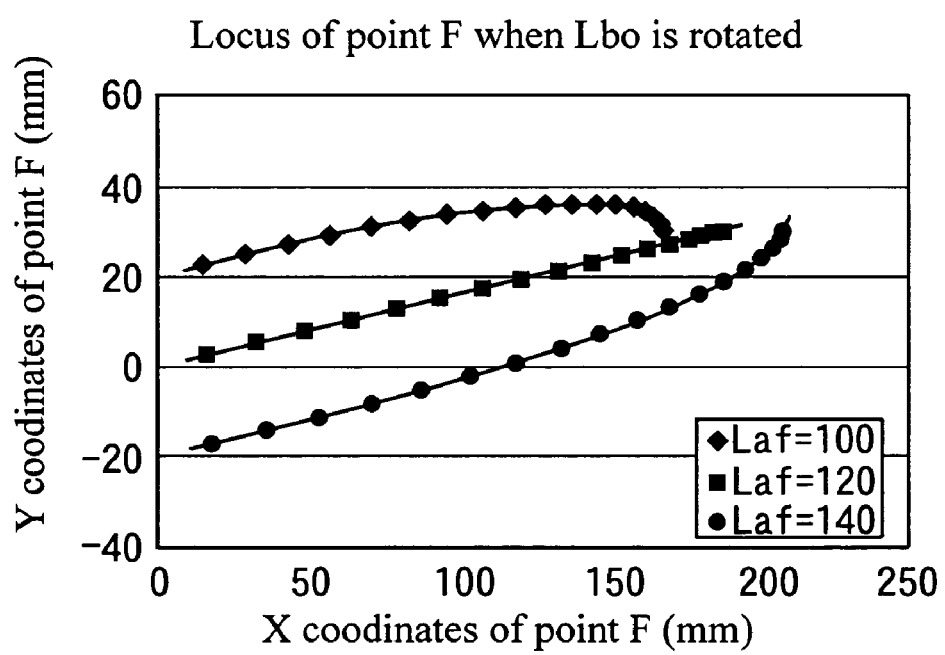
FIG. 4 is a graph showing the locus of the point F in the carrying mechanism of FIG. 2
Figure 5:
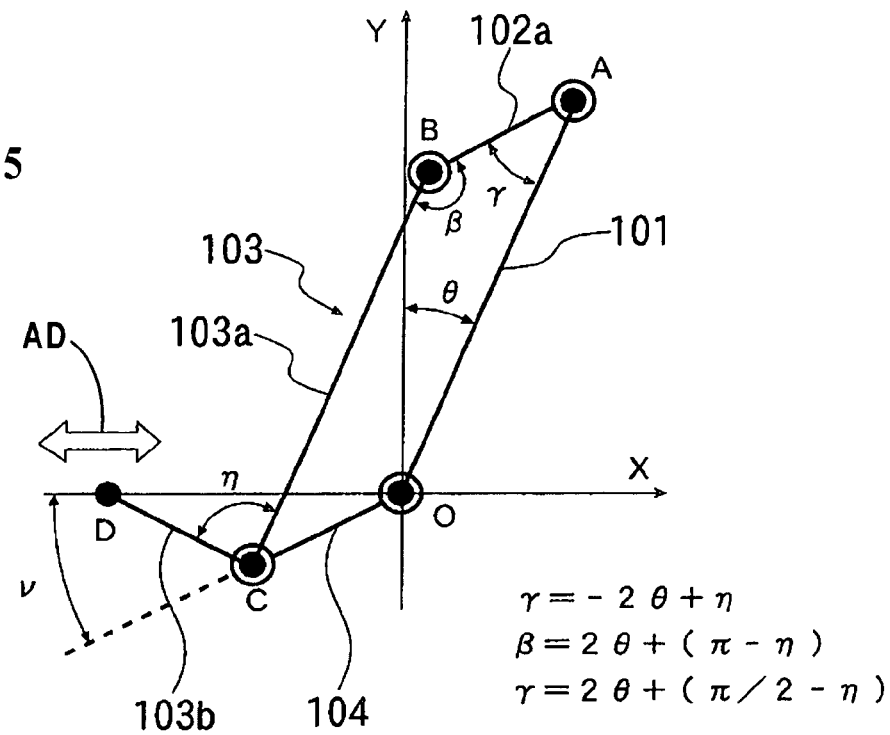
FIG. 5 is a schematic configuration diagram showing the operating principle of the carrying mechanism according to the second invention (Framing conditions [1] and [2]).
Figure 6:
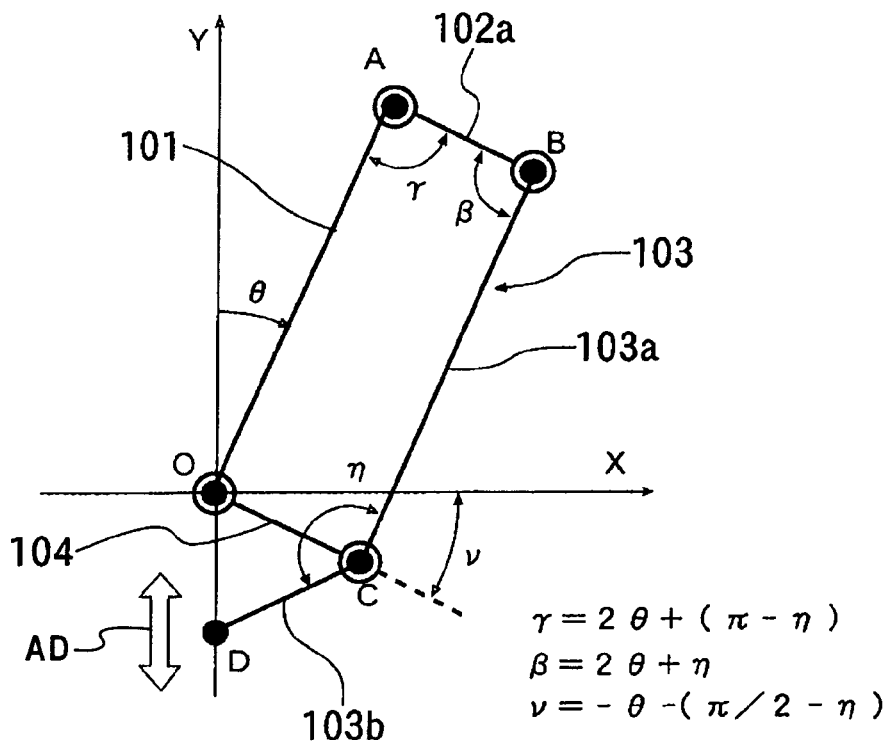
FIG. 6 is a schematic configuration diagram showing the operating principle of the carrying mechanism according to the second invention (Framing conditions [1] and [2]).

Furthermore, in the above-mentioned embodiments, the carrying mechanism of the type in which the first parallelogram linkage is fitted to the rotating shaft (point O) shown in FIG. 1 has been explained by way of example, but the present invention is not limited thereto. As shown in FIG. 2, it is possible to use the carrying mechanism of a type in which the first parallelogram linkage is fitted onto the pivot moving mechanism (point E).

In this case, the conditions explained for the carrying mechanism shown in FIG. 2 are to be complied with.

Furthermore, in the embodiments of the first invention, as shown in FIGS. 1 and 2, the carrying mechanisms of the type in which the linear guide is provided on the straight line passing through the point O and the point E of the second parallelogram link mechanism are explained by way of example, but the present invention is not limited to one using such a linear guide. As is clear from the above-mentioned operating principle, any mechanism may be used, so long as it can move the point E linearly toward the point O. Also in this case, since the point E can move linearly toward the point O, the operating principle and the operating method of the carrying mechanism are to be in accordance with the conditions explained in the above-mentioned embodiments. This similarly applies to the second invention. Any linear guide may be used in the second invention, so long as the mechanism can move the point D linearly toward the point O.

What is claimed is:

1. A carrying mechanism, comprising:
a first parallelogram link mechanism; and
a second parallelogram link mechanism formed by using a given link of the first parallelogram link mechanism, the second parallelogram link mechanism having four sides with an equal length and being extendable and retractable linearly in a predetermined direction, wherein
a first restrained link constituting the first parallelogram link mechanism and a second restrained link constituting the second parallelogram link mechanism are configured to rotate in a state such that the first and second restrained links are restrained at a given angle at one end of a common link shared between the first and second parallelogram link mechanisms, and a first restrained link constituting the first parallelogram link mechanism and a second restrained link constituting the second parallelogram link mechanism are configured to rotate in a state such that the first and second restrained links are restrained at a given angle at the other end of the common link shared between the first and second parallelogram link mechanisms, and
the carrying mechanism comprises a carrying arm member configured such that the carrying arm member rotates in such a state that the carrying arm member is restrained at a given angle relative to an opposed link opposed to the common link in the first parallelogram link mechanism, at a pivot of a given end of the opposed link.

2. The carrying mechanism according to claim 1, wherein the length of the first restrained link is equal to that of the carrying arm member.

3. The carrying mechanism according to claim 1, wherein an angle formed by the first restrained link and the second restrained link is an angle other than 90°.

4. The carrying mechanism according to claim 1, which comprises a third parallelogram link mechanism, the third parallelogram link mechanism being formed by using the first restrained link and having a first arm member and a second arm member, the first arm member and the second arm member being configured to rotate around pivots of both ends of the first restrained link in such a state that the first arm member is restrained at a given angle relative to the common link and that the second arm member is restrained at a given angle relative to the opposed link.

5. A carrying mechanism, comprising:
a first link mechanism formed by a parallelogram link mechanism; and
a second link mechanism having a common link and a second restrained link, the common link being common with a given link of the first link mechanism, and the second restrained link being equal to the common link in length and being configured to rotate in a state that the second restrained link is restrained together with a first restrained link of the first link mechanism at a given angle at one end of the common link,
wherein the carrying mechanism comprises a carrying arm member configured to rotate in a state that the carrying arm member is restrained at a given angle relative to an opposed link opposed to the common link in the first link mechanism, at a pivot of a given end of the opposed link.

6. A carrying device comprising a carrying mechanism, a parallel link type arm mechanism, and a carrying portion,
the carrying mechanism comprising a first parallelogram link mechanism, and a second parallelogram link mechanism formed by using a given link of the first parallelogram link mechanism, the second parallelogram link mechanism having four sides with an equal length and being extendable and retractable linearly in a predetermined direction, wherein a first restrained link constituting the first parallelogram link mechanism and a second restrained link constituting the second parallelogram link mechanism are configured to rotate in the state such that the first and second restrained links are restrained at a given angle at one end of a common link shared between the first and second parallelogram link mechanisms, and a first restrained link constituting the first parallelogram link mechanism and a second restrained link constituting the second parallelogram link mechanism are configured to rotate in a state such that the first and second restrained links are restrained at a given angle at the other end of the common link shared between the first and second parallelogram link mechanisms, and the carrying mechanism comprises a carrying arm member configured such that the carrying arm member rotates in a state such that the carrying arm member is restrained at a given angle relative to an opposed link opposed to the common link in the first parallelogram link mechanism, at a pivot of a given end of the opposed link,
the parallel link type arm mechanism being formed by using the carrying arm member, and
the carrying portion being driven by the parallel link type arm mechanism and supporting an object to be carried.

7. A vacuum processing apparatus with a plurality of processing chambers connected to a vacuum exhaust system,
the vacuum processing apparatus comprising a carrying chamber and a vacuum processing chamber,
the carrying chamber being equipped with a carrying device, the carrying device comprising a first parallelogram link mechanism, and a second parallelogram link mechanism formed by using a given link of the first parallelogram link mechanism, the second parallelogram link mechanism having four sides with an equal length and being extendable and retractable linearly in a predetermined direction,
wherein a first restrained link constituting the first parallelogram link mechanism and a second restrained link constituting the second parallelogram link mechanism are configured to rotate in a state such that the first and second restrained links are restrained at a given angle at one end of a common link shared between the first and second parallelogram link mechanisms, and a first restrained link constituting the first parallelogram link mechanism and a second restrained link constituting the second parallelogram link mechanism are configured to rotate in a state such that the first and second restrained links are restrained at a given angle at the other end of the common link shared between the first and second parallelogram link mechanisms and the carrying mechanism comprises a carrying arm member configured such that the carrying arm member rotates in a state such that the carrying arm member is restrained at a given angle relative to an opposed link opposed to the common link in the first parallelogram link mechanism, at a pivot of a given end of the opposed link,
the parallel link type arm mechanism being formed by using the carrying arm member,
the carrying portion being adapted to be driven by the parallel link type arm mechanism and to support an object to be carried, and
the vacuum processing chamber being communicated with the carrying chamber and configured to receive and deliver the object by using the carrying device.

8. A carrying mechanism, comprising:
a first parallelogram link mechanism, and
a second parallelogram link mechanism formed by using a given link of the first parallelogram link mechanism, the second parallelogram link mechanism having four sides with an equal length and being extendible and retractable linearly in a predetermined direction, wherein
a first restrained link constituting the first parallelogram link mechanism and a second restrained link constituting the second parallelogram link mechanism are configured to rotate in a state such that the first and second restrained links are restrained at 90 degrees, at one end of a common link shared between the first and second parallelogram link mechanisms, and a first restrained link constituting the first parallelogram link mechanism and a second restrained link constituting the second parallelogram link mechanism are configured to rotate in a state such that the first and second restrained links are restrained at 90 degrees, at the other end of the common link shared between the first and second parallelogram link mechanisms, and
the carrying mechanism comprises a carrying arm member configured such that the carrying arm member rotates in a state such that the carrying arm member is restrained at 90 degrees relative to an opposed link opposed to the common link in the first parallelogram link mechanism, at a pivot of a given end of the opposed link.

9. A carrying device comprising a carrying mechanism, a parallel link type arm mechanism, and a carrying portion,
the carrying mechanism comprising a first link mechanism formed by a parallelogram link mechanism, and a second link mechanism comprising a common link and a second restrained link, the common link being common with a given link of the first link mechanism, and the second restrained link being equal to the common link in length and being configured to rotate in a state such that the second restrained link is restrained together with a first restrained link of the first link mechanism at a given angle at one end of the common link,
wherein the carrying mechanism comprises a carrying arm member configured to rotate in a state such that the carrying arm member is restrained at a given angle relative to an opposed link opposed to the common link in the first link mechanism, at a pivot of a given end of the opposed link, the parallel link type arm mechanism being formed by using the carrying arm member, and the carrying portion being driven by the parallel link type arm mechanism and supporting an object to be carried.

10. A vacuum processing apparatus with a plurality of processing chambers connected to a vacuum exhaust system, the vacuum processing apparatus comprising a carrying chamber and a vacuum processing chamber, the carrying chamber being equipped with a carrying device, the carrying device comprising a first link mechanism formed by a parallelogram link mechanism, and a second link mechanism comprising a common link and a second restrained link, the common link being common with a given link of the first link mechanism, and the second restrained link being equal to the common link length and being configured to rotate in a state such that the second restrained link is restrained together with a first restrained link of the first link mechanism at a given angle at one end of the common link, wherein the carrying mechanism comprises a carrying arm member configured to rotate in a state such that the carrying arm member is restrained at a given angle relative to an opposed link opposed to the common link in the first link mechanism, at a pivot of a given end of the opposed link, the parallel link type arm mechanism being formed by using the carrying arm member, the carrying portion being adapted to be driven by the parallel link type arm mechanism and to support an object to be carried, and the vacuum processing chamber being communicated with the carrying chamber and configured to receive and deliver the object by using the carrying device.

* * * * *